(12) United States Patent
Fujiyama et al.

(10) Patent No.: US 6,970,313 B1
(45) Date of Patent: Nov. 29, 2005

(54) WRITE COMPENSATION CIRCUIT AND SIGNAL INTERPOLATION CIRCUIT OF RECORDING DEVICE

(75) Inventors: Hirokuni Fujiyama, Osaka (JP); Shiro Dosho, Osaka (JP); Hiroyuki Nakahira, Kyoto (JP); Akira Yamamoto, Osaka (JP); Hiroki Mouri, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/539,206

(22) Filed: Mar. 30, 2000

(30) Foreign Application Priority Data

| Mar. 31, 1999 | (JP) | ................................. 11-094133 |
| Dec. 1, 1999 | (JP) | ................................. 11-342656 |

(51) Int. Cl.[7] ................................. G11B 5/09
(52) U.S. Cl. ................. 360/51; 360/67; 360/68; 360/39; 327/101; 327/102; 327/149; 327/158; 327/161
(58) Field of Search .................... 360/67–68, 39, 360/51, 46; 327/101–102, 149, 158, 161

(56) References Cited

U.S. PATENT DOCUMENTS

| 4,922,141 A | * | 5/1990 | Lofgren et al. ............. 327/158 |
| 5,101,117 A | * | 3/1992 | Johnson et al. ............. 327/149 |
| 5,878,097 A | * | 3/1999 | Hase et al. .................. 375/371 |
| 5,986,830 A | * | 11/1999 | Hein ............................ 360/45 |
| 6,125,157 A | * | 9/2000 | Donnelly et al. ........... 375/371 |
| 6,424,184 B1 | * | 7/2002 | Yamamoto et al. ......... 327/102 |

FOREIGN PATENT DOCUMENTS

| JP | 63-281514 | 11/1988 |
| JP | 11-168364 | 6/1999 |

OTHER PUBLICATIONS

B. Garlepp et al.; "A Portable Digital DLL Architecture for CMOS Interface Circuits"; *1988 Symposium on VLSI Circuits Digest of Technical Papers*; pp. 214-215.
Japanese Office Action for corresponding Application 11-342656, dated Apr. 13, 2004.

* cited by examiner

*Primary Examiner*—David Hudspeth
*Assistant Examiner*—Natalia Figueroa
(74) *Attorney, Agent, or Firm*—Renner, Otto, Boisselle & Sklar, LLP

(57) ABSTRACT

A write compensation circuit of a recording device includes a first delay portion driven by a first driving voltage, for receiving a clock signal, delaying the clock signal by a first delay time, and outputting the delayed clock signal, and a voltage supplying portion for supplying the first driving voltage to the first delay portion in such a manner that the first delay time is substantially equal to a clock period of the clock signal.

3 Claims, 21 Drawing Sheets

WRITE COMPENSATION CIRCUIT AND SIGNAL INTERPOLATION CIRCUIT OF RECORDING DEVICE

BACKGROUND OF THE INVENTION

1. Field of the Invention

The present invention relates to a write compensation circuit and a signal interpolation circuit. The signal interpolation circuit of this invention receives a pair of input signals having different phases and outputs a pair of output signals each having a phase similar to that of the corresponding input signal and another output signal having a phase intermediate between the pair of output signals.

2. Description of the Related Art

Upon reproduction of data recorded in a recording device, peak shift of a reproduced waveform occurs. Among methods known for compensating the peak shift is a write compensation method in which when recording a particular bit sequence of data, the phase of a signal representing a prescribed bit is adjusted.

A write compensation circuit portion which carries out the write compensation method has a delay generating section including a plurality of delay circuits having a plurality of buffers. The delay generating section controls the number of buffers which are driven by the delay circuits and generates a plurality of delay signals. The write compensation circuit portion has a selector which selects one of the plurality of delay signals to generate a write clock and generates write data in response to the write clock.

"A 300 Mb/s BiCMOS EPR4 Read Channel for Magnetic Hard Disks", pp. 378, 379, Proc. of IEEE, 1998, ISSCC, discloses a technique used for the delay generating section in the write compensation circuit portion, which utilizes VCO.

The delay amount of a clock can be held constant by means of the VCO technique in the delay circuit generating a write compensation amount. The stability of the delay amount can be protected from a source voltage change and variation in circuits caused by a temperature change and the like. When the VCO technique is applied to the delay generating section, additional circuits for compensating temperature and phase are required.

A signal interpolation circuit has been developed which receives a pair of waveform signals having a phase difference, and generates a plurality of waveform signals spaced equally in phase between the pair of waveform signals. "A Portable Digital DLL Architecture for CMOS Interface Circuits", pp. 214–215, 1998, Symposium on VLSI Circuits Digest of Technical Papers discloses such a signal interpolation circuits. An example of the disclosed signal interpolation circuit is shown in FIG. 23. A signal interpolation circuit 62e, for example, has two input terminals x1 and x2 and nine output terminals y1 through y9. When the signal interpolation circuit 62e receives signals Va and Vb having a different phase from each other from the input terminals X1 and X2, respectively, as shown in FIG. 24A, the signal interpolation circuit 62e outputs a pair of output signals Vk' and Vs' having phases similar to those of the input signals Va and Vb, respectively, and seven interpolation signals Vl' through Vr' spaced equally in phase between the pair of output signals Vk' and Vs' from the output terminals y1 through y9, respectively, as shown in FIG. 24B.

FIG. 25 is a circuit diagram illustrating a specific configuration of the signal interpolation circuit 62e. The signal interpolation circuit 62e shown in FIG. 25 includes a pair of inverters 41 and 42 and a first interpolation processor portion 10. The inverters 41 and 42 receive signals Va and Vb input from input terminals X1 and X2, respectively. The first interpolation processor portion 10 interpolates signals Va' and Vb' output from the inverters 41 and 42, respectively, and outputs a pair of output signals Vc and Ve having phases similar to those of the input signals Va' and Vb', respectively, and an interpolation signal Vd having a phase intermediate between the signals Vc and Ve.

The signals Vc through Ve output from the first interpolation processor portion 10 are input to three inverters 43, 44, and 45, respectively. The inverters 43, 44, and 45 output signals Vc' through Ve', respectively, to a second interpolation processor portion 20. The second interpolation processor portion 20 interpolates the signals Vc' through Ve' and outputs five signals vf, Vg, Vh, Vi, and Vj. Specifically, the pair of signals Vc' and Vd' and the pair of signals Vd' and Ve' are subjected to interpolation similar to that in the first interpolation processor portion 10.

The signals Vf through Vj output from the second interpolation processor portion 20 are input to five inverters 46, 47, 48, 49, and 50, respectively. Output signals Vf' through Vj' of the inverters 46 through 50, respectively, are input to a third interpolation processor portion 30. The third interpolation processor portion 30 interpolates the signals Vf' through Vj' and outputs nine signals Vk, Vl, Vm, Vn, Vo, Vp, Vq, Vr, and Vs. Specifically, the pair of signals Vf' and Vg', the pair of signals Vg' and Vh', the pair of signals Vh' and Vi', and the pair of signals Vi' and Vj' are subjected to interpolation similar to that in the first interpolation processor portion 10. The nine interpolating signals Vk through Vs output from third interpolation processor portion 30 are input to nine inverters 51 through 59, respectively. Outputs of the inverters 51 through 59 are output from output terminals y1 through y9 as output signals Vk' thorough Vs', respectively.

The first interpolation processor portion 10 includes a pair of first circuit blocks 11, a common second circuit block 12, and a pair of second circuit blocks 12. The pair of first circuit blocks 11 receive the outputs Va' and Vb' of the inverters 41 and 42, respectively. The common second circuit block 12 receives the outputs Va' and Vb' of the inverters 41 and 42, respectively. The pair of second circuit blocks 12 receive the outputs Va' and Vb' of the inverters 41 and 42, respectively.

Each first circuit block 11 has a similar configuration which includes a single inverter 11a as shown in FIG. 26A. All the second circuit blocks 12 as well as the common second circuit block 12 have a similar configuration which includes a pair of inverters 12a as shown in FIG. 26B. The common second circuit block 12 outputs a combination of outputs of the pair of inverters 12a.

As shown in FIG. 27, the outputs Va' and Vb' of the inverters 41 and 42, respectively, are input to the respective first circuit blocks 11, and are inverted to the output signals Vc and Ve. Outputs of the inverters 41 and 42 are input to the respective inverters 12a of the common second circuit block 12. A combination of the outputs of both the inverters 12a is the output Vd of the common second circuit block 12. The outputs Vc and Ve of the first circuit block 11 and the output Vd of the common second circuit block 12 are inverted by the inverters 43 and 45, and 44, respectively, to be output into the second interpolation processor portion 20.

In the second interpolation processor portion 20, the output signal Vc' of the inverter 43 and the output Vd' of the inverter 44 are input to the respective first circuit blocks 11 and a single common second circuit block 12. The outputs Vf and Vh are output from the respective first circuit blocks 11. The output Vg is output from the common second circuit block 12. The output signal Vd' of the inverter 44 and the output Ve' of the inverter 45 are input to the respective first circuit blocks 11 and a single common second circuit block 12. The outputs Vh and Vj are output from the respective first circuit blocks 11. The output Vi is output from the common second circuit block 12. The outputs Vf through Vj are input to the inverters 46 through 50. The inverters 46 through 50 output the signals Vf' through Vj', respectively.

In the third interpolation processor portion 30, the output signals Vf' through Vj' from the inverters 46 through 50 are input to the respective first circuit blocks 11. An output signal of each pair of adjacent inverters (46 and 47, 47 and 48, 48 and 49, and 49 and 50) is input to a common second circuit block 12. The five first circuit blocks 11 output the signals Vk, Vm, Vo, Vq, and Vs, respectively. The four common second circuit blocks 12 output the signals Vl, Vn, Vp, and Vr. The output signals Vk through Vs are input to the inverters 51 through 59 which output the interpolating signals Vk' through Vs', respectively.

The circuit size of each inverter 11a included in the first circuit block 11 is designed to be substantially equal to the total of the circuit size of each pair of inverters 12a included in the common second circuit block 12. For this reason, as shown in FIG. 5, the inverters 43 and 44 into which the outputs Vc and Ve from the first circuit block 11 are input, respectively, each have a load equal to that of the inverter 45 into which the output Vd from the common second circuit block 12 is input. The signals Va' and Vb' output from the inverters 41 and 42 have the same propagation time by the time of being output from the inverters 43 through 45 as the signals Vc' through Ve', respectively.

In the first interpolation processor portion 10, a pair of first circuit blocks 11 and a single second circuit block 12 are included in a signal interpolation circuit. A pair of input signals Va' and Vb' output from the inverters 41 and 42 have the same propagation time by the time of being output from the inverters 43 through 45 as the three signals Vc' through Ve', respectively.

In the second interpolation processor portion 20, a pair of first circuit blocks 11 and a single second circuit block 12 are included in a signal interpolation circuit. In each interpolation circuit block, input signals have the same propagation time from input to output. The three signals Vc' through Ve' output from the inverters 43 through 45 have the same propagation time by the time of being output from the inverters 46 through 50 as the five signals vf' through Vj', respectively.

In the third interpolation processor portion 30, a pair of first circuit blocks 11 and a single second circuit block 12 are included in a signal interpolation circuit. The five signals Vf' through Vj' output from the inverters 46 through 50 have the same propagation time by the time of being output from the nine inverters 51 through 59 as the signals Vk' through Vs', respectively.

The inverters 11a and 12a in each signal interpolation circuit invert the level of an output signal when an input signal goes to a state which is higher than a predetermined threshold voltage Vth from a lower state, or when the input signal goes to the lower state from the higher state. As shown in FIG. 28A, when the output Vd of the common second circuit block 12 is input to the inverter 44, the input signal Vd goes from the state which is higher than the threshold voltage Vth to the lower state and the level of the output signal of the inverter 44 is inverted. Therefore, the output signal Vd' of the inverter 44 ideally has a phase intermediate between those of the signals Vc' and Ve' output from the inverters 43 and 45 as shown in FIG. 28B.

However, the threshold voltage Vth of the inverter is set in an appropriate voltage range, The output Vd of the common second circuit block 12 has a state in which there is substantially no change in a voltage for an appropriate time as shown in FIG. 28C. For this reason, the signal Vd' does not have an intermediate phase which does not space equally in phase between the signals Vc' and Ve' output from the inverters 43 and 45. A pair of signals having a phase difference is unlikely to be linearly interpolated.

SUMMARY OF THE INVENTION

According to one aspect of the present invention, a write compensation circuit of a recording device includes a first delay portion driven by a first driving voltage, for receiving a clock signal, delaying the clock signal by a first delay time, and outputting the delayed clock signal; and a voltage supplying portion for supplying the first driving voltage to the first delay portion in such a manner that the first delay time is substantially equal to a clock period of the clock signal.

In one embodiment of this invention, the voltage supplying portion includes a second delay portion driven by a second driving voltage and having the same configuration as that of the first delay portion, for receiving a clock signal, delaying the clock signal by a second delay time, and outputting the delayed clock signal; a determining portion for determining whether the second delay time is within a predetermined range; and a voltage select portion for selecting, according to a result of determination of the determining portion, the first driving voltage supplied to the first delay portion and selecting the second driving voltage supplied to the second delay portion.

In one embodiment of this invention, the first delay portion includes a selector for selecting a predetermined pattern in response to a select signal; and a delay circuit for delaying the clock signal by a delay amount corresponding to the predetermined pattern selected by the selector.

According to another aspect of the present invention, a signal interpolation circuit in which a pair of input signals having different phases are split into a pair of output signals having a phase similar to that of the pair of input signals, respectively, and an output signal having a phase intermediate between the phases of the pair of output signals; and by including a plurality of elements, the pair of output signals and the output signal having the intermediate phase have substantially the same propagation speed, further includes a control section for controlling the propagation speed.

In one embodiment of this invention, the control section controls propagation speeds of input and output signals into and from each of the plurality of elements.

In one embodiment of this invention, the control section controls speeds of input and output signals into and from each of the plurality of elements.

In one embodiment of this invention, the control section adjusts propagation speeds of input and output signals into and from each of the plurality of elements in accordance with the phase difference of the pair of input signals.

In one embodiment of this invention, the control section adjusts propagation speeds of input and output signals into and from each of the plurality of elements in accordance with a change in the phase difference of the pair of input signals.

Thus, the invention described herein makes possible the advantages of (1) providing a relative relationship between a delay of each buffer and a clock period by designing a delay circuit having a plurality of buffers in such a manner that an overall delay is substantially equal to the clock period; (2) providing a write compensation circuit which does not require circuit portions for providing temperature compensation and phase compensation in addition to a delay generating section and has a small-size circuit as compared with a write compensation circuit using VCO; and (3) providing a signal interpolation circuit capable of generating a high-accuracy interpolating signal which linearly interpolates a pair of signals having a phase difference.

These and other advantages of the present invention will become apparent to those skilled in the art upon reading and understanding the following detailed description with reference to the accompanying figures.

DESCRIPTION OF THE PREFERRED EMBODIMENTS

Hereinafter, examples of this invention will be described with reference to the accompanying drawings.

EXAMPLE 1

Figure 1:
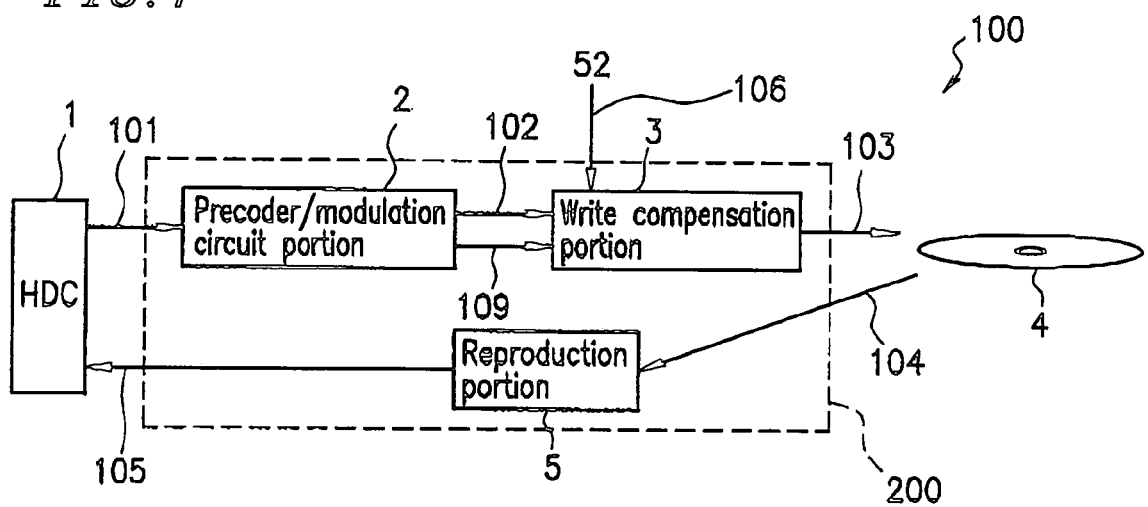
FIG. 1 is a block diagram illustrating an overall configuration of a magnetic recording and reproducing device 100 according to Example 1 of this invention.

FIG. 1 is a block diagram illustrating an overall configuration of a magnetic recording and reproducing device 100 according to Example 1 of this invention. The magnetic recording and reproducing device 100 includes a hard disk controller 1 (hereinafter referred to as "HDC"), a magnetic disk 4, and a read channel portion 200 having a precoder/modulation circuit portion 2, a write compensation portion 3, and a reproduction portion 5.

The HDC 1 controls the operation of the magnetic disk 4. The magnetic disk 4 is a recording medium for recording data using magnetism. The precoder/modulation circuit portion 2, the write compensation portion 3, and the reproduction portion 5 are provided between the HDC 1 and the magnetic disk 4.

The precoder/modulation circuit portion 2 receives user data via a signal line 101 from the HDC 1 and subjects the user data to precode and data modulation. The write compensation portion 3 receives modulated data output from the precoder/modulation circuit portion 2 via a signal line 102 and receives a select signal output from the precoder/modulation circuit portion 2 via a signal line 109. The write compensation portion 3 also receives a clock signal 52 via a signal line 106 and generates write data from the modulated data in response to the clock signal 52 and the select signal. The write data generated by the write compensation portion 3 is written onto the magnetic disk 4 via a signal line 103. The above-described signal system, in which the user data is written from the HDC 1 via the precoder/modulation circuit portion 2 and the write compensation portion 3 onto the magnetic disk 4, is referred to as a write system.

The reproduction portion 5 receives read data read out of the magnetic disk 4 via the signal line 104. The HDC 1 receives a signal output from the reproduction portion 5 via a signal line 105. The above-described signal system, in which the read data read out of the magnetic disk 4 is written via the reproduction portion 5 onto the HDC 1, is referred to as a read system.

Figure 2:
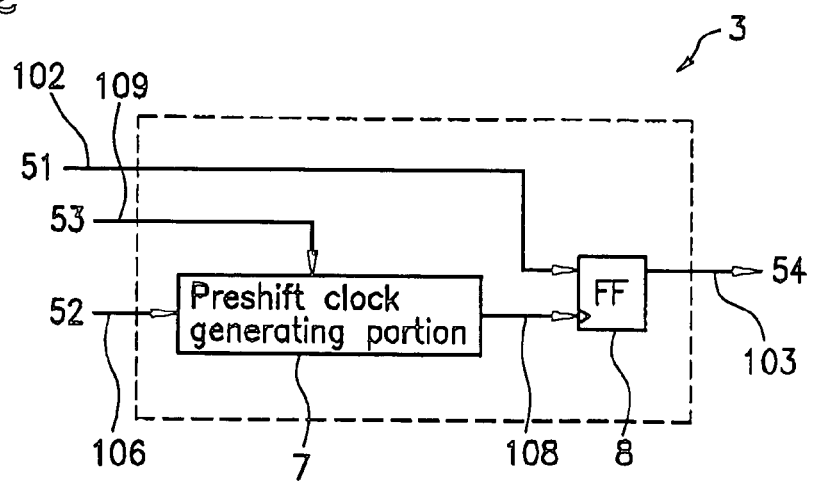
FIG. 2 is a block diagram illustrating a configuration of a write compensation portion 3 included in the magnetic recording and reproducing device 100 shown in FIG. 1.

FIG. 2 illustrates a configuration of the write compensation portion 3 included in the magnetic recording and reproducing device 100 shown in FIG. 1. As shown in FIG. 2, the write compensation portion 3 includes a preshift clock generating portion 7 and a flip-flop 8. In FIG. 2, the write compensation portion 3 receives modulated data 51 output from the precoder/modulation circuit portion 2 in FIG. 1, a select signal 53, and the clock signal 52 for operating the system, and outputs write data 54. As described above, the modulated data 51, the select signal 53, and the clock signal 52 are input via the signal lines 102, 109, and 106, respectively, into the write compensation portion 3. The preshift clock generating portion 7 generates a preshift clock based on the select signal 53 and the clock signal 52. The flip-flop 8 latches the modulated data 51 by the preshift clock received via a signal line 108, and outputs write data 54.

Figure 3:
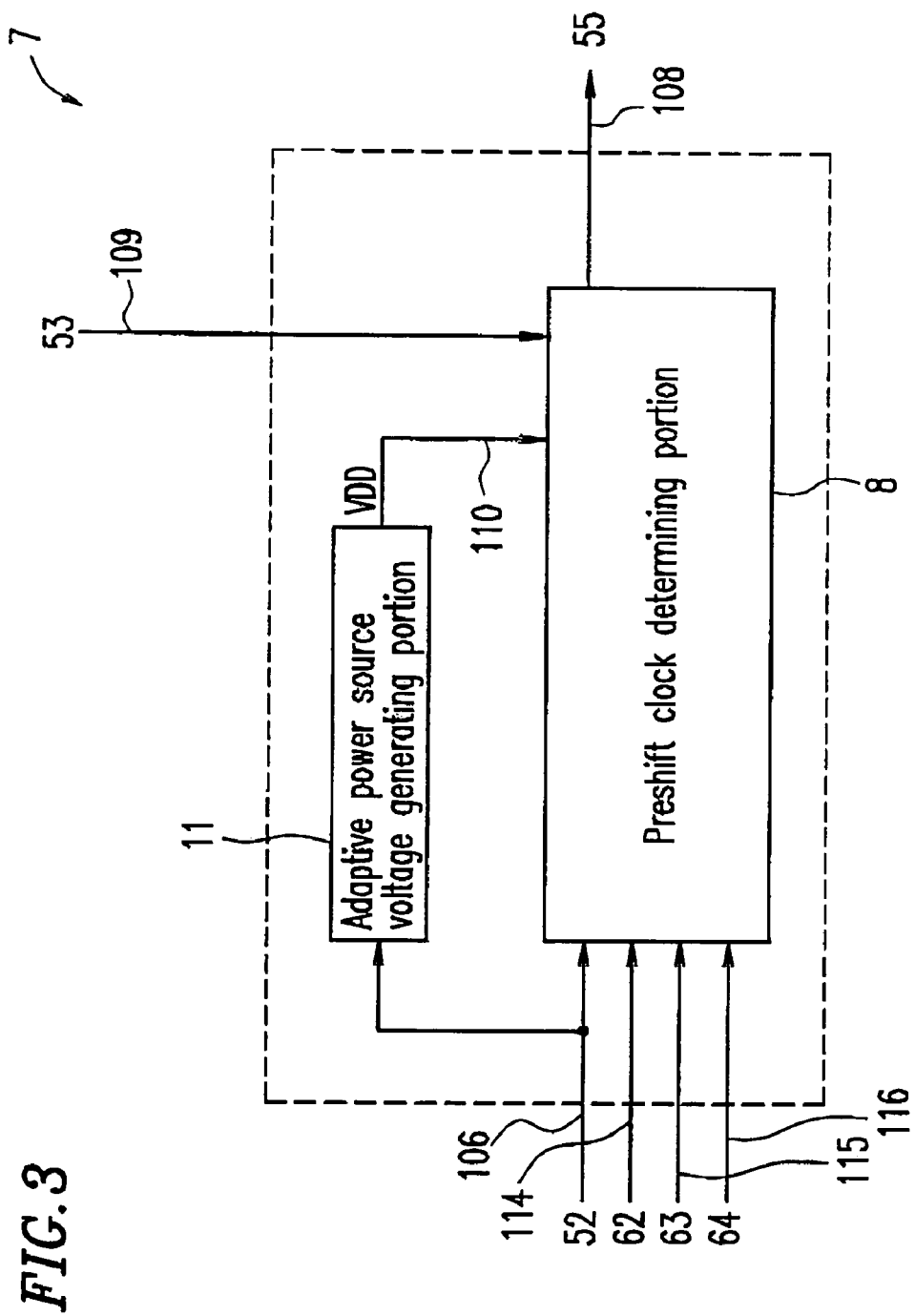
FIG. 3 is a block diagram illustrating a configuration of a preshift clock generating portion 7 included in the write compensation portion 3 shown in FIG. 2.

FIG. 3 illustrates a configuration of the preshift clock generating portion 7 included in the write compensation portion 3. As shown in FIG. 3, the preshift clock portion 7 includes a preshift clock determining portion 8 (first delaying portion) and an adaptive power source voltage generating portion 11 (voltage supplying portion). In FIG. 3, the preshift clock generating portion 7 receives the clock signal 52 and patterns 62, 63, and 64, and outputs a write clock 55. The clock signal 52, and the patterns 62, 63, and 64 are input via the signal line 106, and signal lines 114, 115, and 116, respectively, into the preshift clock generating portion 7. The patterns 62, 63, and 64 are constant patterns which are generated by a pattern generating portion (not shown) included in the magnetic recording and reproducing device 100.

The adaptive power source voltage generating portion 11 generates a driving voltage VDD which causes an overall delay amount of a delay circuit portion (described later) to be substantially equal to the clock signal 52. The preshift clock determining portion 8 generates the write clock signal 55 based on the received clock signal 52, the pattern 62, 63, and 64, the driving voltage VDD, and the select signal 53.

Figure 4A:
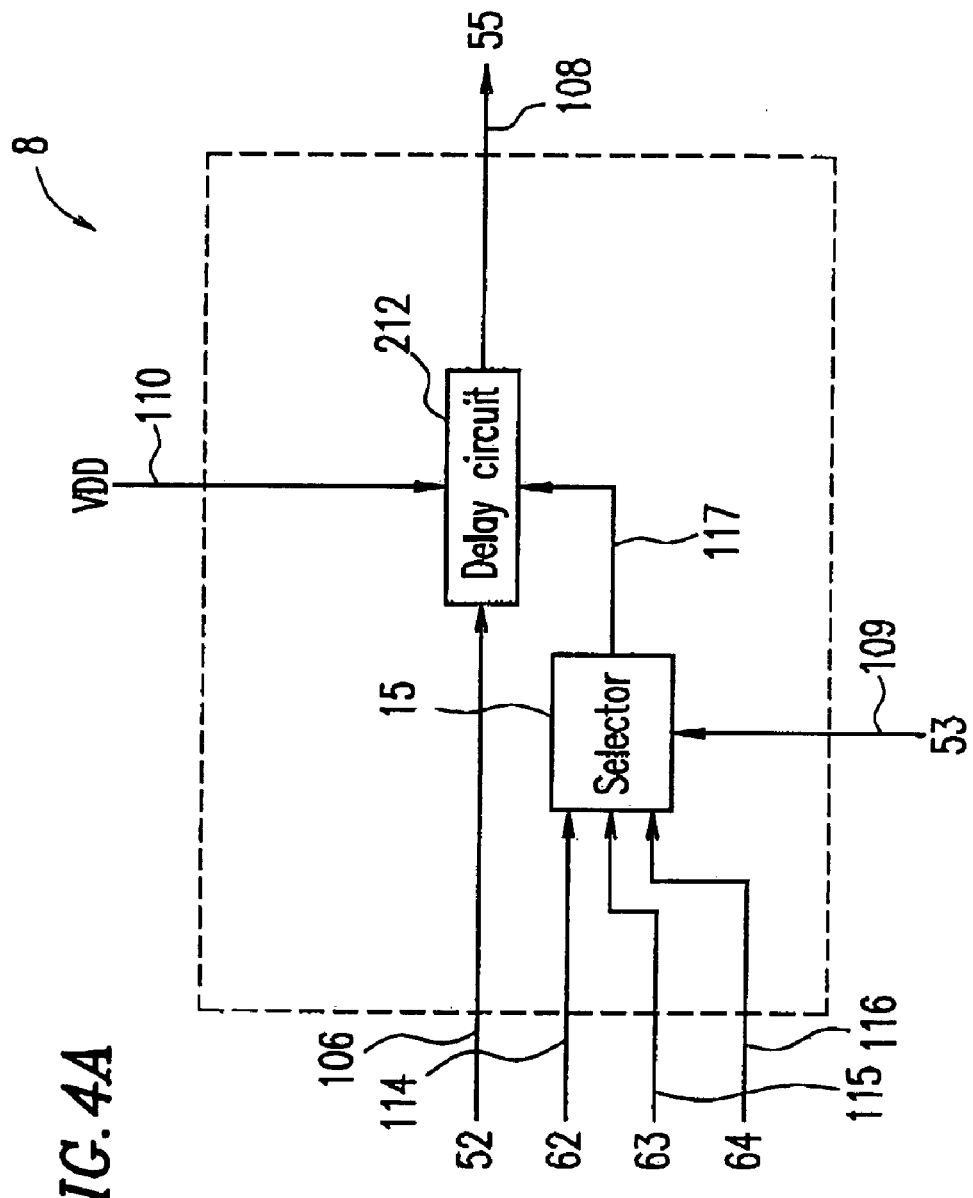
FIG. 4A is a block diagram illustrating an example of a configuration of a preshift clock determining portion 8 included in the preshift clock generating portion 7 shown in FIG. 3.

FIG. 4A illustrates an example of a configuration of the preshift clock determining portion 8 included in the preshift clock generating portion 7. The preshift clock determining portion 8 includes a delay circuit 12 and a selector 15.

The delay circuit 12 delays the clock signal 52 received via the signal line 106 by a delay amount corresponding to an input pattern from the selector 15, and outputs the delayed clock signal 52 as the write clock signal 55. The delay circuit 12 is driven by the driving voltage VDD generated by the adaptive power voltage portion 11 shown in FIG. 3. For this reason, the greater the driving voltage VDD, the smaller the delay amount. In other words, the smaller the driving voltage VDD, the greater the delay amount.

The selector 15 selects and outputs one of the patterns 62, 63, and 64 which are input to the selector 15 via the signal lines 114, 115, and 116, respectively. The selected pattern is input via a signal line 117 from the selector 15 to the delay circuit 12. The pattern selection by the selector 15 is carried out in response to the select signal 53 which is input via the signal line 109 to the selector 15.

Figure 4B:
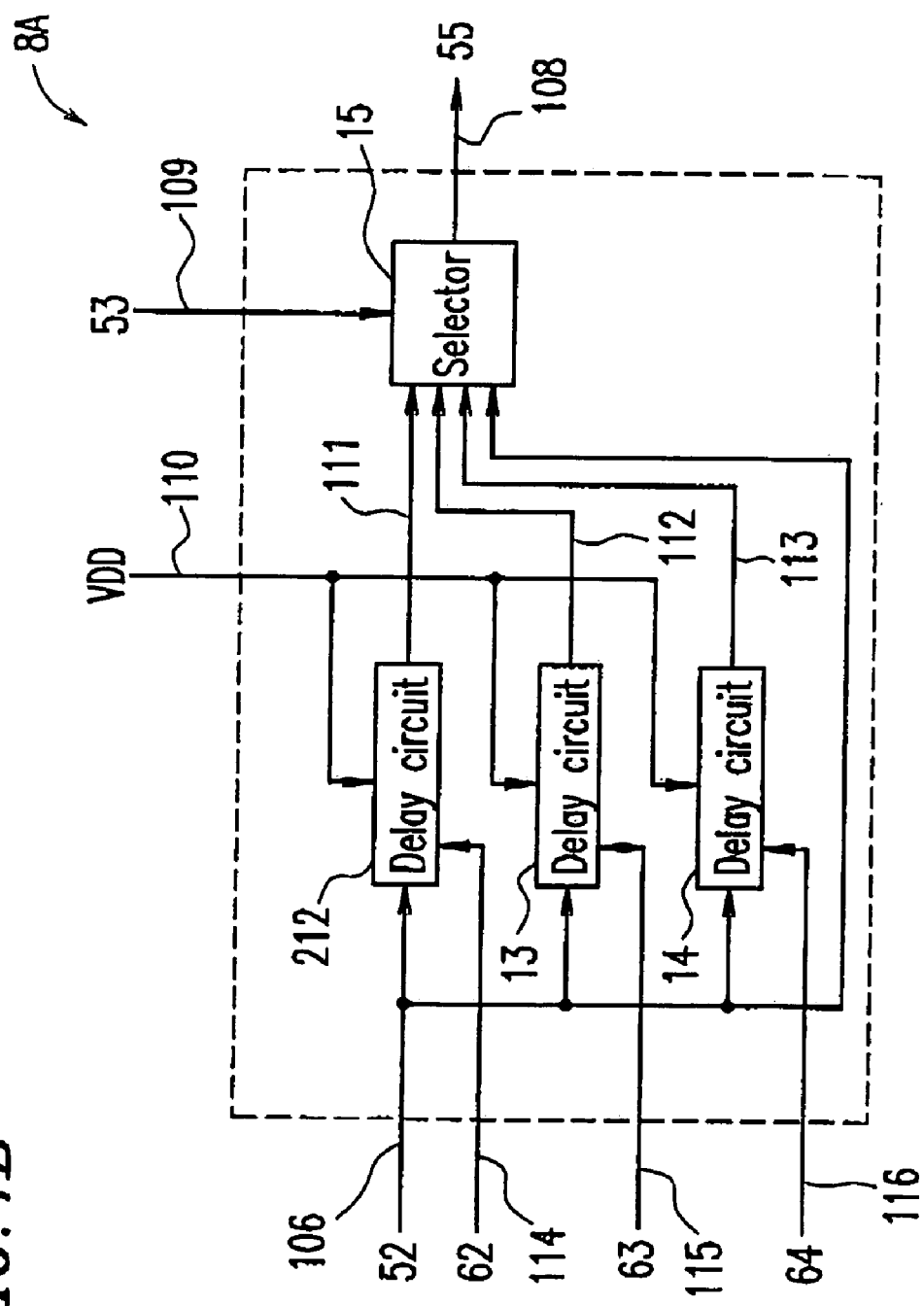
FIG. 4B is a block diagram illustrating another example of a configuration of the preshift clock determining portion 8 included in the preshift clock generating portion 7 shown in FIG. 3.

FIG. 4B illustrates another example of a configuration of the preshift clock determining portion 8 included in the preshift clock generating portion 7 shown in FIG. 3. The preshift clock determining portion 8A shown in FIG. 4B includes delay circuits 212, 13, and 14, and a selector 15.

In FIG. 4B, as is different from FIG. 4A, each of the delay circuits 212, 13, and 14 has almost a constant delay amount, since the delay circuits 212, 13, and 14 receive constant patterns 62, 63, and 64, respectively. The delay circuits 212, 13, and 14 is driven by a driving voltage VDD as is the delay circuit 14 in FIG. 4A. Therefore, the delay amounts vary depending on the magnitude of the driving voltage VDD.

A clock signal 52 input to the preshift clock 8A is delayed by predetermined delay amounts by the delay circuits 212, 13, and 14. The delayed clock signals are output via signal lines 111, 112, and 113 into the selector 15. The selector 15 also receives a clock signal 52, which is not delayed, other than the delayed clock signals. The selector 15 selects one of the three delayed clock signals and the clock signal 52 in response to a select signal 53 received via a signal line 109. The selector 15 outputs the selected clock signal into a write clock 55 via a signal line 108.

Figure 5:
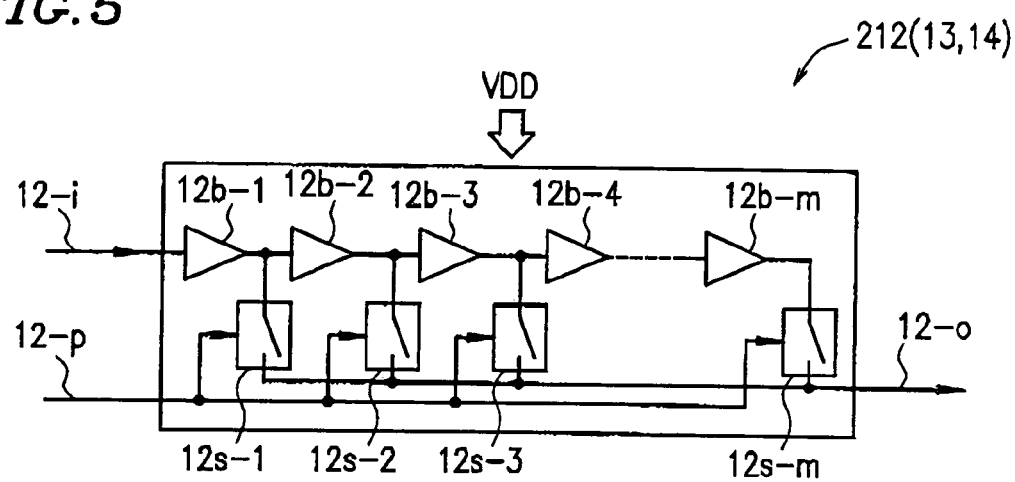
FIG. 5 is a circuit diagram illustrating an example of a configuration of a delay circuit 212, 13, or 14 shown in FIGS. 4A and 4B, or a delay circuit portion 19 shown in FIG. 6.

FIG. 5 illustrates an example of a configuration of the delay circuits 212 shown in FIGS. 4A and 4B. The delay circuits 13 and 14 have the same configuration as that of the delay circuit 12.

Here the signal lines 106 at the input sides of the delay circuits 212, 13, and 14 in FIGS. 4A and 4B correspond to a signal line 12-$i$ in FIG. 5. The signal line 10S at the output side of the delay circuit 12 in FIG. 4A and the signal lines 111, 112, and 113 at the output sides of the delay circuits 212, 13, and 14 in FIG. 4B correspond to a signal line 12-$o$ in FIG. 5. The signal line 117 via which the delay circuit 12 receives a signal pattern in FIG. 4A and the signal lines 114, 115, and 116 via which the delay circuits 212, 13, and 14 receive the signal patterns 62, 63, and 64 in FIG. 4B correspond to a signal line 12-$p$ in FIG. 5.

The delay circuit 12 in FIG. 5 includes m buffer circuits 12$b$-1 through 12$b$-$m$ and m switching circuits 12$s$-$l$ through 12$s$-$m$.

The delay amount of a signal in the delay circuit 12 in FIG. 5 is determined when only one of the switching circuits 12$s$-$l$ through 12$s$-$m$ is in the ON state and the others are in the OFF state. When one of the switching circuits 12$s$-$l$ through 12$s$-$m$ is in the ON state, a signal input from the signal line 12-$i$ is delayed by the buffer circuit 12$b$-1 through 12$b$-$m$ to a buffer circuit corresponding to the ON-state switching circuit, and output from the signal line 12-$o$. For example, when the switching circuit 12$s$-3 is in the ON state, a signal input from the signal line 12-$i$ is delayed by the buffer circuits 12$b$-$l$ to 12$b$-3, and output from the signal line 12-$o$.

The ON/OFF switching of the switching circuits 12$s$-1 through 12$s$-$m$ is controlled by patterns input via a signal line 12-$p$. The delay amounts of the delay circuits 212, 13, and 14 are controlled by the input patterns 62, 63, and 64.

Since the delay circuit 12 is driven by the driving voltage VDD, a high level of the driving voltage VDD hastens the operation of the delay circuit 12, so that the delay amount is relatively small. On the other hand, a low level of the driving voltage VDD slows the operation of the delay circuit 12, so that the delay amount is relatively large.

Figure 6:
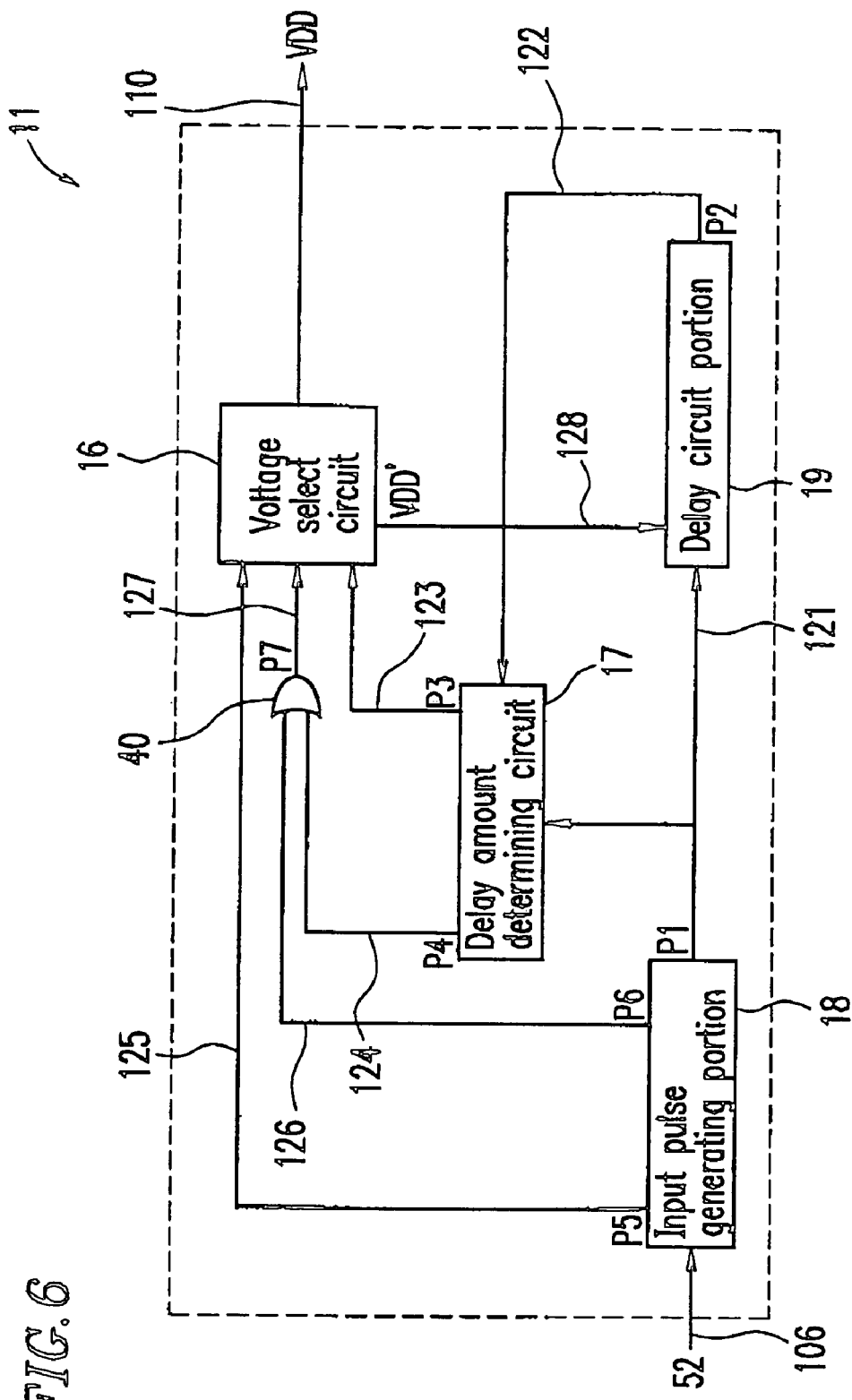
FIG. 6 is a block diagram illustrating an adaptive power source voltage generating portion 11 included in the preshift clock generating portion 7 shown in FIG. 3.

FIG. 6 illustrates the adaptive power source voltage generating portion 11 included in the preshift clock generating portion 7 shown in FIG. 3. The adaptive power source voltage generating portion 11 includes a voltage select circuit 16 (voltage select portion), a delay amount determining circuit 17 (determining portion), an input pulse generating portion 18, a delay circuit portion 19 (second delay portion), and an OR circuit 40.

The input pulse generating portion 18 generates an input pulse signal P1 and pulse signals P5 and P6 based on a received clock signal 52. The input pulse signal P1 has a pulse width representing a target delay amount. The pulse signal P5 is used for updating a driving voltage VDD'. The pulse signal P6 is used for updating a driving voltage VDD. The delay circuit portion 19 delays the input pulse signal P1 and outputs the resultant pulse signal as an output pulse signal P2. The delay amount determining circuit 17 determines whether the delay amount of the output pulse signal P2 relative to the input pulse signal P1 is greater than the target delay amount. The delay amount determining circuit 17 then outputs a determination signal P3 representing the result of the determination and a pulse signal P4 obtained by inverting the pulse signal P3. The OR circuit 40 calculates the logical OR of the pulse signals P4 and P6 output from the delay amount determining circuit 17 and outputs a pulse signal P7.

The voltage select circuit 16 receives the determination signal P3 and the pulse signals P5 and P7 via the signal lines 123, 125, and 127. The voltage select circuit 16 outputs the target driving voltages VDD and VDD'. As described above, the driving voltage VDD drives the delay circuits 212, 13, and 14 shown in FIGS. 4A and 4B. The driving voltage VDD' drives the delay circuit portion 19. The voltage select circuit 16 selects one of a plurality of predetermined different voltages in accordance with the determination signal P3 and the pulse signal P5 and outputs the selected voltage as the driving voltage VDD'. The voltage select circuit 16 selects one of a plurality of predetermined different voltages in accordance with the determination signal P3 and the pulse signal P7 and outputs the selected voltage as the driving voltage VDD.

The determination signal P3 is used for indicating whether of the plurality of voltages a higher voltage or lower voltage should be output. Specifically, when the determination signal P3 has a LOW level, the signal P3 indicates that a lower voltage of the plurality of voltages is output. When the determination signal P3 has a HIGH level, the signal P3 indicates that a higher voltage of the plurality of voltages is output.

The delay circuit portion 19 has a configuration similar to those of the delay circuits 212, 13, and 14 in FIGS. 3 and 4A. As Is different from the delay circuits 212, 13, and 14, the delay circuit portion 19 is designed in such a manner that the delay amount of a signal is maximum. For example, when the delay circuit portion 19 has a configuration shown in FIG. 5, only the switch 12$a$-$m$ is always in the ON state.

Figure 7:
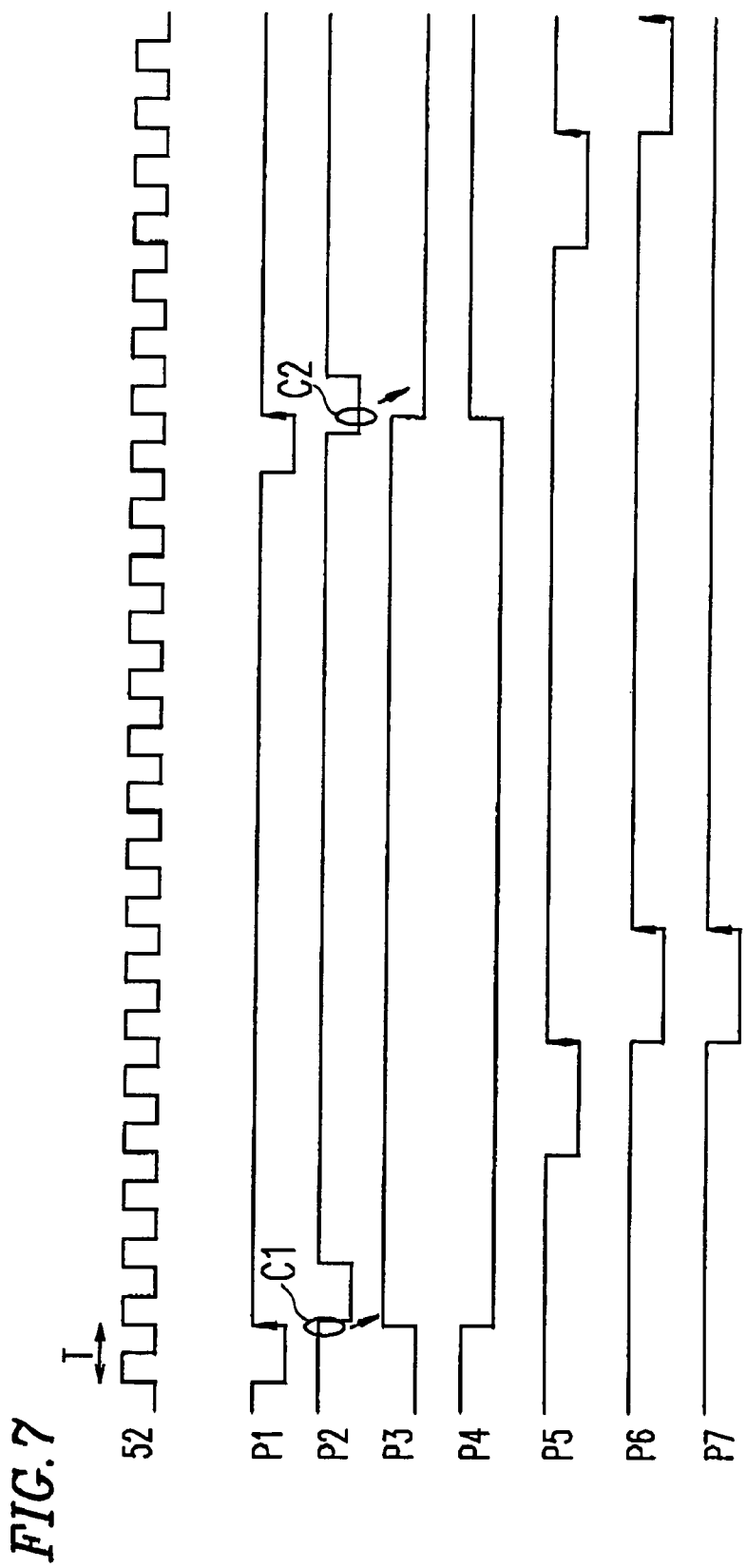
FIG. 7 is a timing chart representing a relationship between a clock signal 52 and pulse signals P1 through P7.

FIG. 7 is a timing chart representing a relationship between the clock signal 52 and the pulse signals P1 through P7.

The pulse signals P1, P5, and P6 are generated in the input pulse signal generating portion 18 (FIG. 6) in such a manner as to have the relationship shown in FIG. 7. As shown in FIG. 7, the pulse signal P1 has a pulse width representing a clock period T which is the target delay amount. The pulse signal P5 has a phase different from that of the pulse signal P1. The pulse signal P5 is used for controlling the timing of update of the driving voltage VDD'. On the other hand, similar to the pulse signal P5, the pulse signal P6 has a phase different from that of the pulse signal P1, and is delayed one cycle after the pulse signal P5. The pulse signal P6 is used for controlling the timing of update of the driving voltage VDD. One-cycle delay of the pulse signal P6 after the pulse signal P5 leads to prevention of misoperation of the voltage select circuit 16.

As described above, the pulse signal P2 is obtained by delaying the pulse signal P1 generated in the delay circuit portion 19 (FIG. 6). The determination signal P3 indicates whether a delay amount in the delay circuit portion 19 is greater than the target delay amount. In FIG. 7, the waveform of the pulse signal P2 is marked with circles C1 and C2 at two positions. At the time point marked with the left-side circle C1, the delay amount of the pulse signal P2 relative to the pulse signal P1 is greater than the target delay amount. This causes the determination signal P3 to go to the HIGH level. At the time point marked with the right-side circle C2, the delay amount of the pulse signal P2 relative to the pulse signal P1 is smaller than the target delay amount. This causes the determination signal P3 to go to the LOW level. As described above, the pulse signal P4 is a NOT of the determination signal P3 and thus has an inverted waveform of the determination signal P3.

The pulse signal P7 is obtained by a logical OR operation of the pulse signals P4 and P6. As shown in FIG. 7, the pulse signal P7 is output in response to the pulse signal P6 only for a period during which the pulse signal P4 has the LOW level. As described above, the period during which the pulse signal P4 has the LOW level (the determination signal P3 has the HIGH level) corresponds to a period during which the driving voltage VDD' rises. The timing of update of the driving voltage VDD is actually controlled using the pulse signal P7 generated based on the pulse signal P6. The update of the driving voltage VDD is carried out in the period during which the driving voltage VDD' rises.

Figure 8:
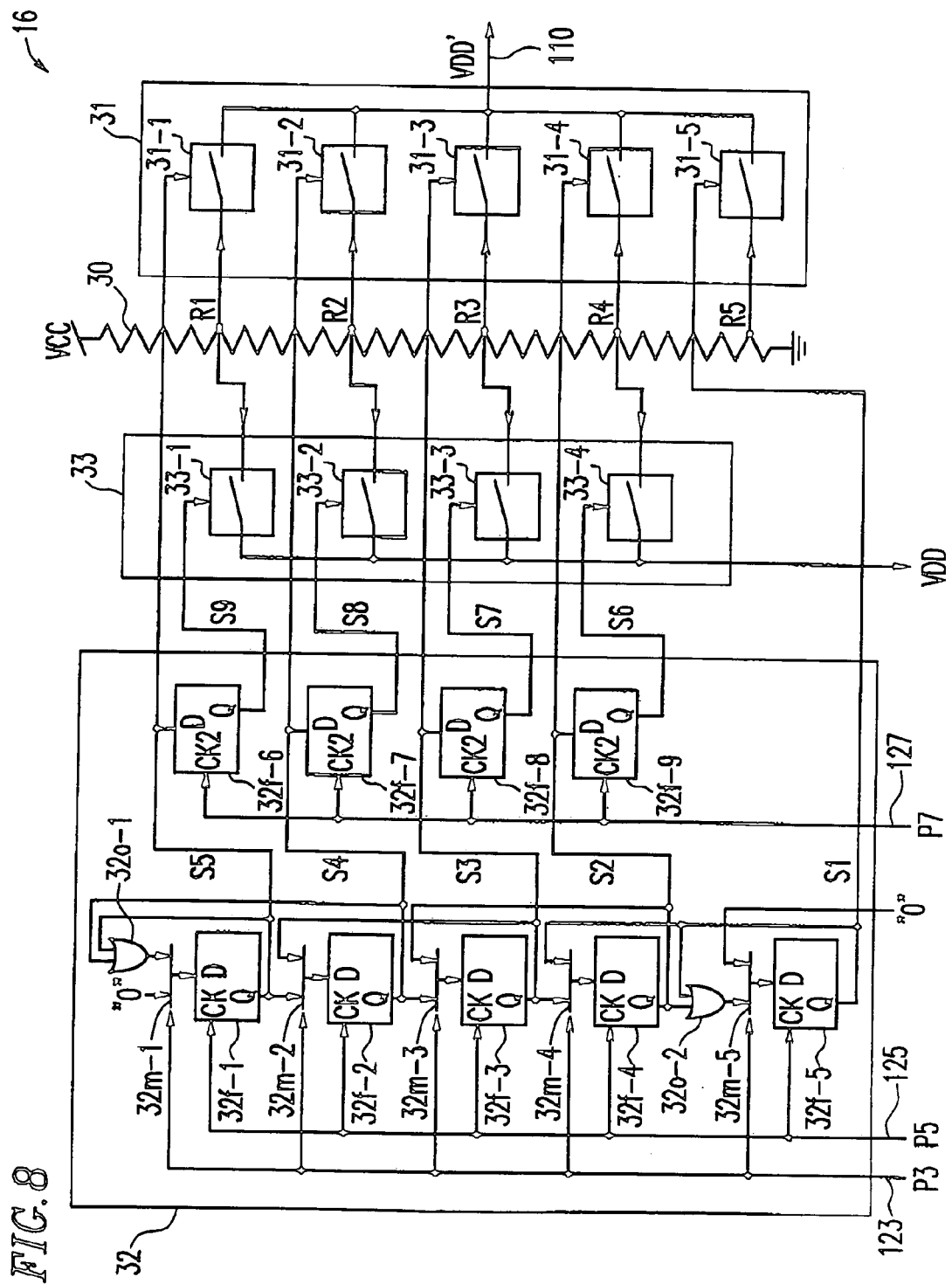
FIG. 8 is a block diagram illustrating a configuration of a voltage select circuit 16 included in the adaptive power source voltage generating portion 11 shown in FIG. 6.

FIG. 8 illustrates a configuration of the voltage select circuit 16 included in the adaptive power source voltage generating portion 11 shown in FIG. 6. The voltage select circuit 16 includes a resistor 30, switching circuits 31 and 33, and a bidirectional control shift circuit 32.

The bidirectional control shift circuit 32 includes D flip-flops 32*f*-1 through 32*f*-9, two-input-and-one-output multiplexers 32*m*-1 through 32*m*-5, and OR circuits 32*o*-1 and 32*o*-2.

Each of the D flip-flops 32*f*-1 through 32*f*-5 receives data from a D flip-flop at the front or rear stage in synchronization with the rising edge of the pulse signal P5 obtained via the signal line 125. Each of the multiplexers 32 *m*-1 through 32*m*-5 selects data to be stored in the corresponding D flip-flop in accordance with the level of the pulse signal P3. The OR circuit 32*o*-1 outputs a logical OR of control signals s4 and S5. The OR circuit 32*o*-2 outputs a logical OR of control signals S1 and S2.

Any but only one of the D flip-flops 32*f-l* through 32*f*-5 holds data having a value "1". The remaining D flip-flops hold data having a value "0". When the determination signal P3 has the LOW level (the delay amount of the pulse signal P2 is smaller than the target delay amount); a D flip-flop holding the value "1" flip-flops another D flip-flop at the front stage (downward in FIG. 8). When the determination signal P3 has the HIGH level (the delay amount of the pulse signal P2 is greater than the target delay amount), a D flip-flop holding the value "1" flip-flops another D flip-flop at the rear stage (upward in FIG. 8). The values held by the D flip-flops 32*f*-1 through 32*f*-5 are input to the D flip-flops 32*f*-6 through 32*f*-9 and the switching circuit 31 as the control signals S1 through S5, respectively.

On the other hand, each of the D flip-flops 32*f* -6 through 32*f*-9 receives data held by the D flip-flops 32*f*-1 through 32*f*-4, respectively, in synchronization with the rising edge of the pulse signal P7 obtained via the signal line 127. Any but only one of the D flip-flops 32*f*-6 through 32*f*-9 holds data having the value "1". The remaining D flip-flops hold data having the value "0". The values held by the D flip-flops 32*f*-6 through 32*f*-9 are input to the switching circuit 33 as the control signals S6 through S9, respectively.

With the above-described configuration, the bidirectional control shift circuit 32 causes any but only one of the control signals S1 through S5 to go to the HIGH level, leaving the remaining control signals at the LOW level. The bidirectional control shift circuit 32 causes any but only one of the control signals S6 through S9 to go to the HIGH level, leaving the remaining control signals at the LOW level.

In FIG. 8, one end of the resistor 30 is connected to a power source voltage VCC while the other end of the resistor 30 is connected to a ground voltage. By means of resistance division, voltages at points R1 through R5 are supplied as voltages V1 through V5 to the switching circuit 31. Voltages V1 through V4 at points R1 through R4 are supplied to the switching circuit 33. Here V1>V2>V3>V4>V5 is satisfied.

The switching circuit 31 includes a plurality of switching elements 31-*l* through 31-5. An end of each switching elements 31-1 through 31-5 is supplied with the corresponding voltages V1 through V5. The control signals S1 through S5 are used for controlling ON/OFF switching of the switching elements 31-1 through 31-5. Only a switching element that receives a control signal having the HIGH level is switched ON. A voltage corresponding to the switched-ON switching element is selected and output as the driving voltage VDD'. For example, when the control signal S3 has the HIGH level and other control signals have the LOW level, only the switching element 31-3 is switched ON and the voltage V3 is output as the driving voltage VDD'.

Preferably, the voltage select circuit 16 limits the output driving voltage VDD' to a predetermined range. The limited range of the driving voltage VDD' is controlled by limiting the numbers of D flip-flops and selectors included in the bidirectional control shift circuit 32.

On the other hand, the switching circuit 33 includes a plurality of switching elements 33-*l* through 33-4. Similar to the switching elements 31-1 through 31-5, an and of each switching elements 33-1 through 33-4 is supplied with the corresponding voltages V1 through V4. The control signals S6 through S9 are used for controlling ON/OFF switching of the switching elements 33-1 through 33-4. Only a switching element that receives a control signal having the HIGH level is switched ON. A voltage corresponding to the switched-ON switching element is selected and output as the driving voltage VDD. For example, when the control signal S8 has the HIGH level and other control signals have the LOW level, only the switching element 33-2 is switched ON and the voltage V2 is output as the driving voltage VDD.

Data stored in the D flip-flops 32*f*-6 through 32*f*-9 is updated when the driving voltage VDD' output from the switching circuit 31 is increased. The driving voltage VDD output from the switching circuit 33 is updated to the driving voltage VDD when the driving voltage VDD' output from the switching circuit 31 is increased. If otherwise, the driving voltage VDD output from the switching circuit 33 is not updated. The initial value of the driving voltage VDD is the same as that of the driving voltage VDD'.

The driving voltage VDD is supplied to the buffer circuit portions of the delay circuits 212, 13, and 14 in FIG. 4B. When the driving voltage VDD' is locked and the driving voltage VDD is supplied to the above-described delay circuits 212, 13, and 14, an overall delay amount of the signals in delay circuits 212, 13, and 14 has the same clock period as that of the clock signal 52.

Figure 9:
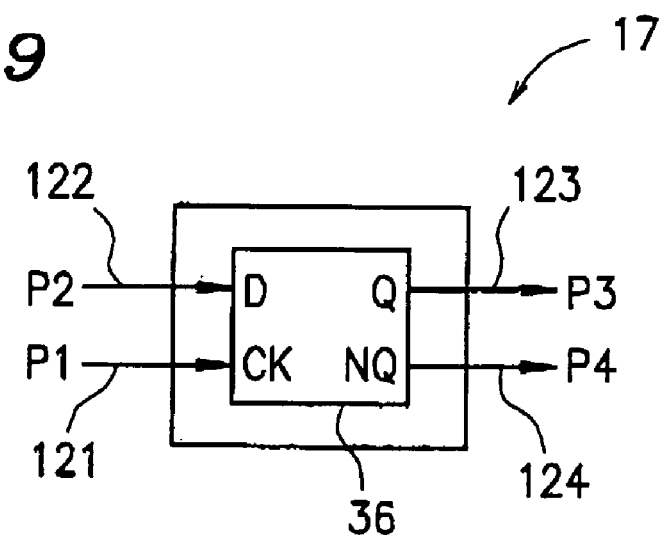
FIG. 9 is a block diagram illustrating a configuration of a delay amount determination circuit 17 included in the adaptive power source voltage generating portion 11 shown in FIG. 6.

FIG. 9 illustrates a configuration of the delay amount determination circuit 17 included in the adaptive power source voltage generating portion 11 shown in FIG. 6. The delay amount determination circuit 17 includes a flip-flop 36. The flip-flop 36 has a data input terminal D, a clock input terminal CK, an output terminal Q, and a NOT output terminal NQ. The delay amount determination circuit 17 receives the output pulse signal P2 of the delay circuit portion 19 (FIG. 6) from the data input terminal D. The delay amount determination circuit 17 receives the input pulse signal P1 of the delay circuit portion 19 (FIG. 6) from the clock terminal CK. The delay amount determination circuit 17 outputs the determination signal P3 and the pulse signal P4 from the output terminal Q and the NOT output terminal NQ, respectively.

A relationship between the input pulse signal P1 and the output pulse signal P2 is classified into two cases. One case is that the output pulse signal P2 has the LOW level at the rising edge of the input pulse signal P1 (circle C2 at the right side of FIG. 7). The other case is that the output pulse signal P2 has the HIGH level at the rising edge of the input pulse P1 (circle C1 at the right side of FIG. 7).

When the output pulse signal P2 has the LOW level at the rising edge of the input pulse signal P1, the delay amount (actual delay amount) of the output pulse signal P2 relative to the input pulse signal P1 is smaller than the target delay amount, the pulse width of the input pulse signal P1 corresponds to the target delay amount.

The output pulse signal P2 has the LOW level at the rising edge of the input pulse signal P1, the delay amount determination circuit 17 outputs the determination signal P3 having the LOW level. This is because that the flip-flop 36 of the delay amount determination circuit 17 receives the level (LOW level) of the output pulse signal P2 as data at the rising edge of the input pulse signal P1. As described above, the voltage select circuit 16 lowers the driving voltage VDD' below the current voltage in response to the determination signal P3 having the LOW level. As a result, the delay amount of the output pulse signal P2 relative to the input pulse signal P1 is increased. As described above, the delay amount of the output pulse signal P2 relative to the input pulse signal P1 becomes closer to the target delay amount.

The output pulse signal P2 has the HIGH level at the rising edge of the input pulse signal P1, the delay amount determination circuit 17 outputs the determination signal P3 having the HIGH level. This is because that the flip-flop 36 of the delay amount determination circuit 17 receives the level (HIGH level) of the output pulse signal P2 as data at the rising edge of the input pulse signal P1. As described above, the voltage select circuit 16 raises the driving voltage VDD' above the current voltage in response to the determination signal P3 having the LOW level. As a result, the delay amount of the output pulse signal P2 relative to the input pulse signal P1 is decreased. As described above, the delay amount of the output pulse signal P2 relative to the input pulse signal P1 becomes closer to the target delay amount.

As a result of the feedback, the value of the driving voltage VDD' is controlled in such a manner that the delay amount of the output pulse signal P2 relative to the input pulse signal P1 becomes substantially equal to the target delay amount. The value of the driving voltage VDD is updated when the driving voltage VDD' rises. Therefore, the delay amounts of the delay circuits 212, 13, and 14 driven by the driving voltage VDD can have a linear relationship with the clock period.

EXAMPLE 2

Figure 10:
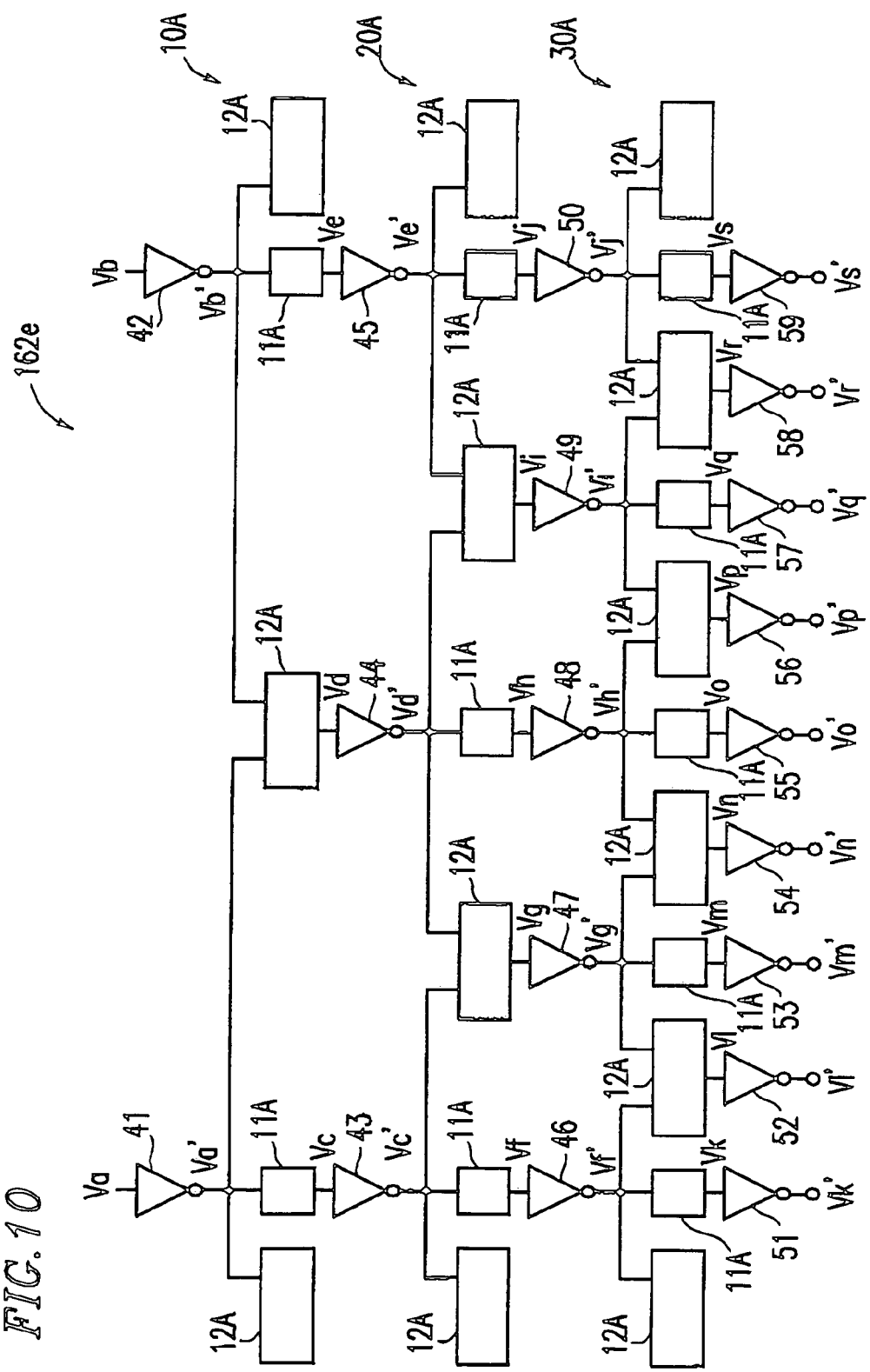
FIG. 10 is a circuit diagram illustrating a concrete configuration of a signal interpolation circuit according to this invention.
Figure 11A:
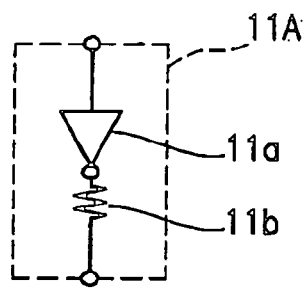
FIG. 11A is a circuit diagram illustrating an example of a concrete configuration of a first circuit block used in the signal interpolation circuit of this invention.
Figure 11B:
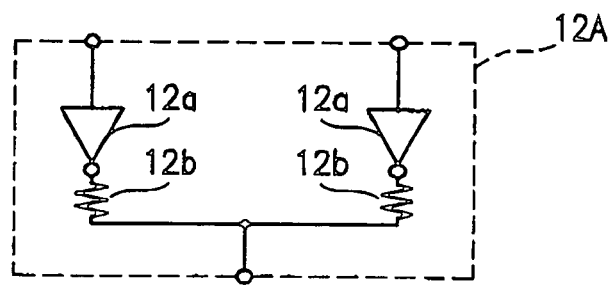
FIG. 11B is a circuit diagram illustrating an example of a concrete configuration of a second circuit block used in the signal interpolation circuit of this invention.

A signal interpolation circuit portion 162e of this invention shown in FIG. 10 includes signal interpolation circuits. Each interpolation circuit includes a first circuit block 11A and a second circuit block 12A. As shown in FIG. 11A, the first circuit block 11A includes an inverter 11a and a resistor 11b arranged in series. As shown in FIG. 11B, the second circuit block 12A includes a pair of inverters 12a and a pair of resistors 12b connected in series to the pair of inverters 12a, respectively. The resistors 12b are combined to provide a single output terminal. The other parts of the configuration are similar to those of the signal interpolation circuit 25.

Figure 12:
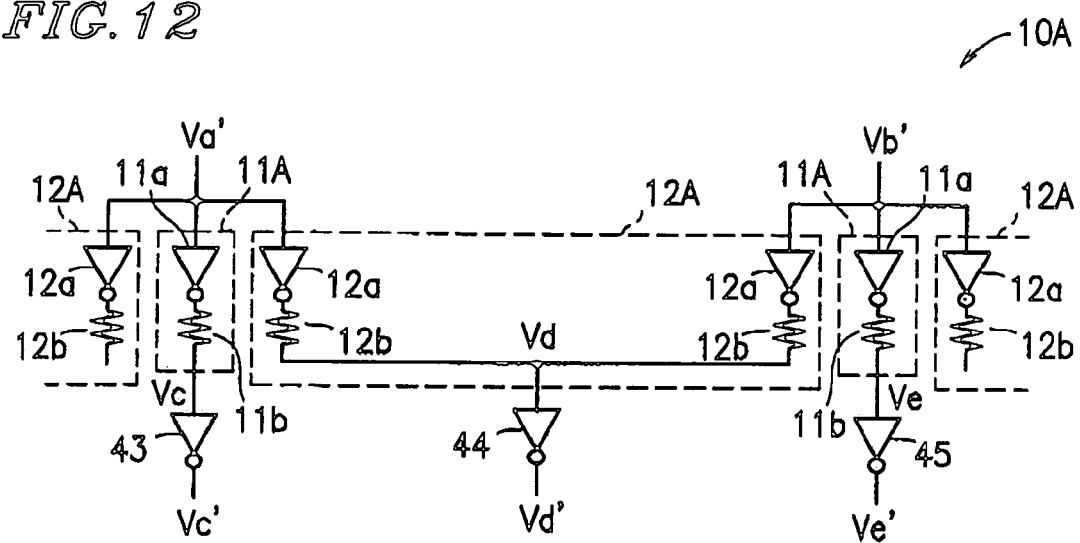
FIG. 12 is a circuit diagram illustrating a concrete configuration of the signal interpolation circuit of this invention using the first and second circuit blocks shown in FIG. 7.

FIG. 12 illustrates a configuration of a main part of a first interpolation processor portion 10A in the signal interpolation circuit of this invention. Output signals Va' and Vb' having different phases output from the inverters 41 and 42, respectively, are input to the respective first circuit blocks 11A. The first circuit blocks 11A outputs the respective signals Vc and Ve using the inverter 11a and the resistor 11b arranged in series. The outputs of the inverters 41 and 42 are input to the respective inverters 12a of a common second circuit block 12A. The outputs of the inverters 41 and 42 pass through the inverters 12a and the resistors 12b connected in series to the respective inverters 12a, and are combined to be output as a signal Vd. The outputs Vc and Ve of the first circuit block 11A and the output Vd of the common second circuit block 12A are input to the inverters 43 and 45 and the inverter 44, respectively, and output as output signals Vc', Ve', and Vd', respectively.

Here the resistances of the resistors 12b of the common second circuit block 12A are represented by R1 and R3. The resistance of the resistor 11b of the first circuit block 11A is represented by R2. These resistors have a relationship represented by the following expression.

$$R2=(R1+R3)/2 \ldots \qquad \text{expression (1)}$$

The inverter 11a included in the first circuit block 11A is designed to have a circuit size substantially equal to the total circuit size of a pair of the inverters 12a included in the common second circuit block 12A.

Figure 13A:
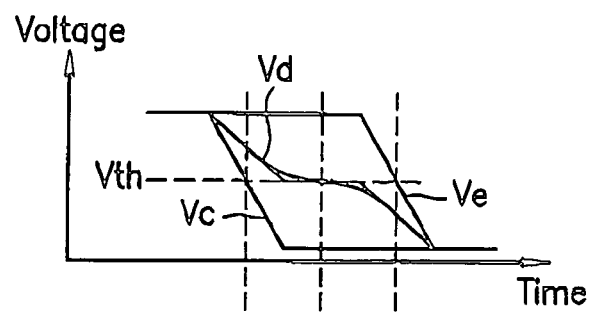
FIG. 13A is a graph showing output signals of the first and second circuit blocks shown in FIG. 12 included in the signal interpolation circuit of this invention.
Figure 13B:
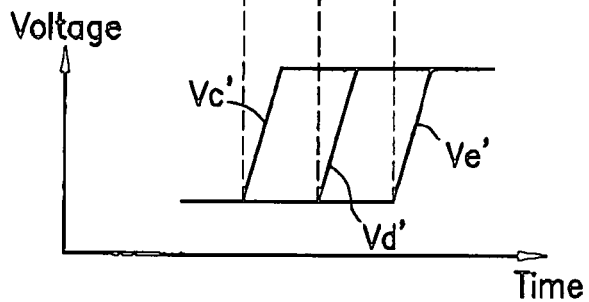
FIG. 13B is a graph showing the inverted output signals shown in FIG. 13A of the first and second circuit blocks included in the signal interpolation circuit of this invention.
Figure 28A:
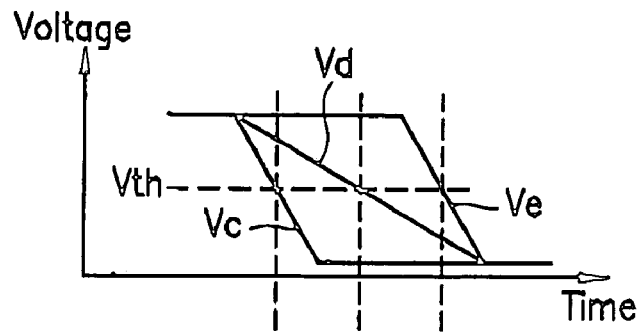
FIG. 28A is a graph showing an ideal set of output signals of the first and second circuit blocks included in the signal interpolation circuit shown in FIG. 27.
Figure 28B:
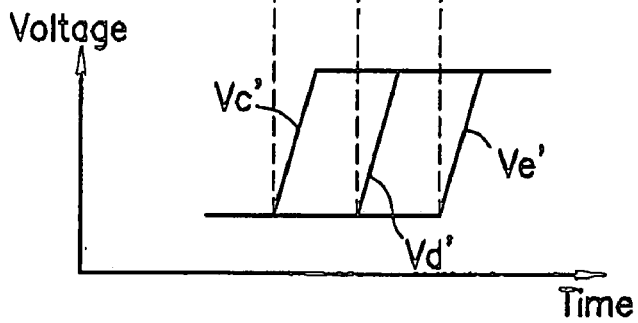
FIG. 28B is a graph showing the inverted output signals shown in FIG. 28A of the first and second circuit blocks included in the signal interpolation circuit shown in FIG. 27.
Figure 28C:
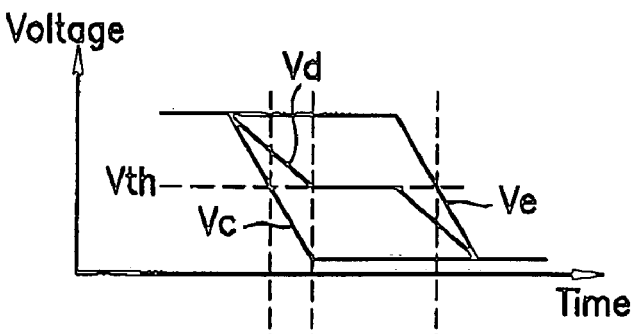
FIG. 28C is a graph showing an actual set of output signals of the first and second circuit blocks included in the signal interpolation circuit shown in FIG. 27.
Figure 28D:
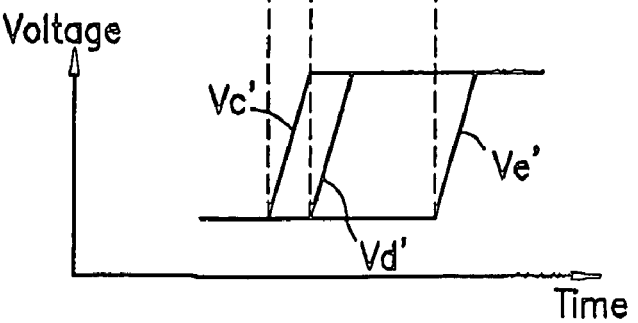
FIG. 28D is a graph showing the inverted output signals shown in FIG. 28C of the first and second circuit blocks included in the signal interpolation circuit shown in FIG. 27.

In this case, the inverters 43 and 44 into which the outputs Vc and Ve from the first circuit block 11A are input, respectively, have a load substantially equal to that of the inverter 45 into which the output Vd from the common second circuit block 12A is input. Moreover, the first and second circuit blocks 11A and 12A are provided with the resistors 11b and 12b, respectively. Therefore, as shown in FIG. 13A, the waveform of the signal Vd output from the common second circuit block 12A has a first-order delay due to the resistors 12b and the input load capacitance of the inverters 12a of the common second circuit block 12A. The waveform of the signal Vd becomes close to the signal Vd shown in FIG. 28A. As a result, the signal Vd' output from the inverter 44 has a phase intermediate between the signals Vc' and Ve' output from the inverters 43 and 44, respectively, as shown in FIG. 13B. A pair of the signals Va and Vb having a phase difference can be certainly interpolated in a linear way.

Figure 14A:
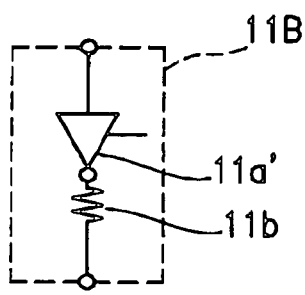
FIG. 14A is a circuit diagram illustrating another example of a concrete configuration of a first circuit block used in the signal interpolation circuit of this invention.
Figure 14B:
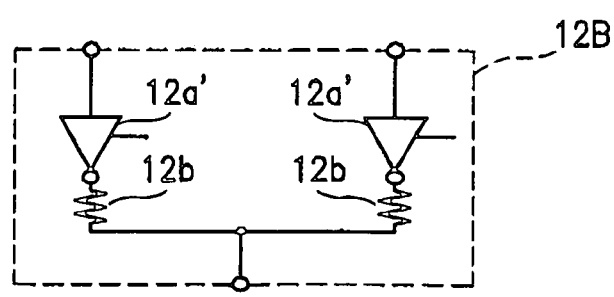
FIG. 14B is a circuit diagram illustrating another example of a concrete configuration of a second circuit block used in the signal interpolation circuit of this invention.

As shown in FIGS. 14A and 14B, inverters 11a' and 12a' to which bias voltage is applied may be used as the inverters 11a and 12a included in the first and second circuit blocks 11A and 12A, respectively.

Figure 15A:
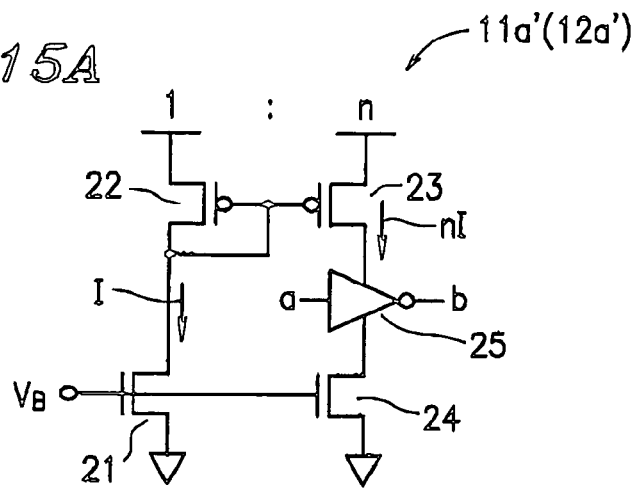
FIG. 15A is a circuit diagram illustrating an example of an inverter used in the first and second circuit blocks shown in FIG. 14.

As shown in FIG. 15A, for example, the inverter 11a' (or 12a') to which bias voltage is applied includes a pair of first and second MOSFETs 21 and 22 arranged in series and a pair of third and fourth MOSFETs 23 and 24 each connected to an inverter portion 25. The input and output of the inverter 11a' (or 12a') are the input and output of the inverter portion 25, respectively.

A bias voltage VB is applied to the gate of the first MOSFET 21. The drain of the first MOSFET 21 is connected to the drain of the second MOSFET 22. The drain and gate of the second MOSFET 22 are connected to each other. The gate of the second MOSFET 22 is connected to the gate of the third MOSFET 23. The source of the third MOSFET 23 is connected to the inverter 25. The drain of the fourth MOSFET 24 is connected to the inverter 25. The bias voltage VB is applied to the gate of the fourth MOSFET 24, similar to the gate of the first MOSFET 21.

The dimension ratio of the first MOSFET 21 to the fourth MOSFET 2, and the dimension ratio of the second MOSFET 22 to the third MOSFET 23 each are 1:n. When the bias voltage VB is applied to the first MOSFET 21, a current I flows from the second MOSFET 22 to the first MOSFET 21. Meanwhile, a control current nI which is n times as large as the current I flows from the third MOSFET 23 to the fourth MOSFET 24. The current nI adjusts the operating speed of the inverter portion 25.

Even when the bias voltages VB have the same value, the control current nI flowing from the third MOSFET 23 to the fourth MOSFET 24 can be modified by changing the dimension ratio n of the first MOSFET 21 to the fourth MOSFET 24 and the dimension ratio n of the second MOSFET 22 to the third MOSFET 23. This makes it possible to adjust the operating speed of the inverter portion 25.

The control current flowing through the inverter portion 25 is changed depending on the applied bias voltage VB. As the bias voltage VB becomes greater, the control current flowing through the inverter portion 25 is increased. As the bias voltage VB becomes smaller, the control current flowing through the inverter portion 25 is decreased.

Figure 15B:
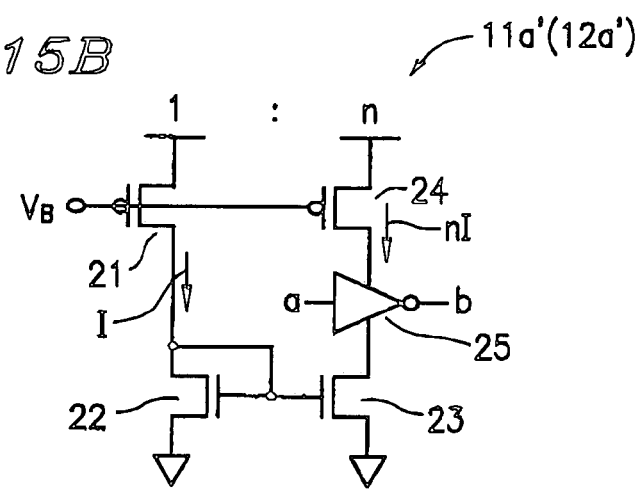
FIG. 15B is a circuit diagram illustrating another example of an inverter used in the first and second circuit blocks shown in FIG. 14.

FIG. 15B illustrates another example of the inverters 11a' and 12a' to which the bias voltage is applied. In this inverter 11a' (or 12a'), the drain of a first MOSFET 21 to which the bias voltage is applied is connected to the drain of a second MOSFET 22. The drain of a fourth MOSFET 24 which is common to the gate of the first MOSFET 21 is connected to the inverter portion 25. The drain of a third MOSFET 23 is connected to the inverter portion 25. The gate of the third MOSFET 23 and the gate of the second MOSFET 22 are connected to each other. The gate and drain of the second MOSFET 22 are connected to each other.

Also in the inverter 11a' (or 12a'), the dimension ratio of the first MOSFET 21 and the fourth MOSFET 24 and the dimension ratio of the second MOSFET 22 and the third MOSFET 23 each are 1:n. When the bias voltage VB is applied to the first MOSFET 21, a current I flows from the second MOSFET 22 to the first MOSFET 21. Meanwhile, a control current nI which is n times as large as the current I flows from the third MOSFET 23 to the fourth MOSFET 24. The current nI adjusts the operating speed of the inverter portion 25.

The control current flowing through the Inverter 25 is changed depending on the applied bias voltage VB. As the bias voltage VB becomes greater, the control current flowing through the inverter portion 25 is decreased. As the bias voltage VB becomes smaller, the control current flowing through the inverter portion 25 is increased.

Figure 16:
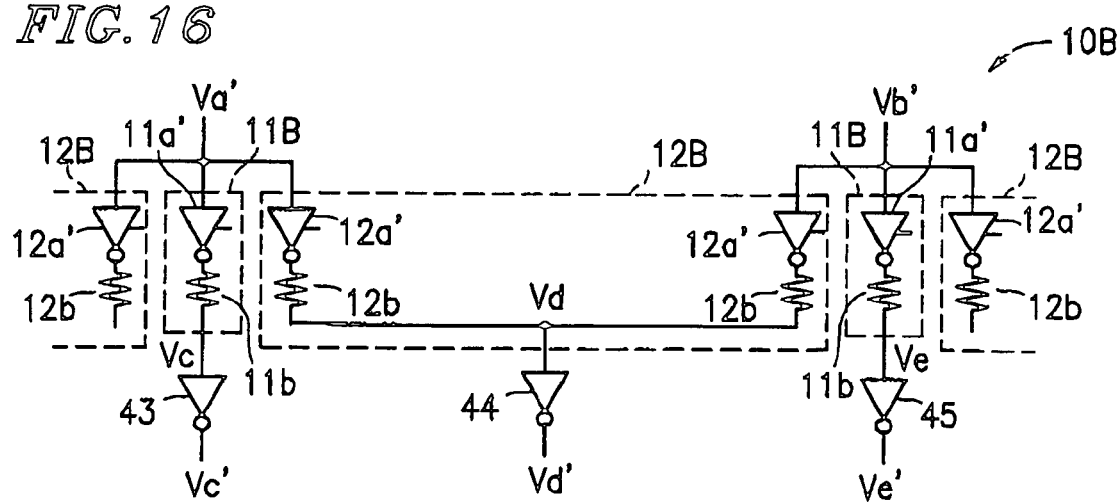
FIG. 16 is a circuit diagram illustrating a concrete configuration of the signal interpolation circuit of this invention using the first and second circuit blocks shown in FIG. 14.

FIG. 16 illustrates another example of a configuration of the signal interpolation circuit of this invention. A first and second circuit blocks 11B and 12B include the inverters 11a' and 12a' shown in FIGS. 15A and 15B in which the applied bias voltage VB adjusts the operating speed.

Figure 17A:
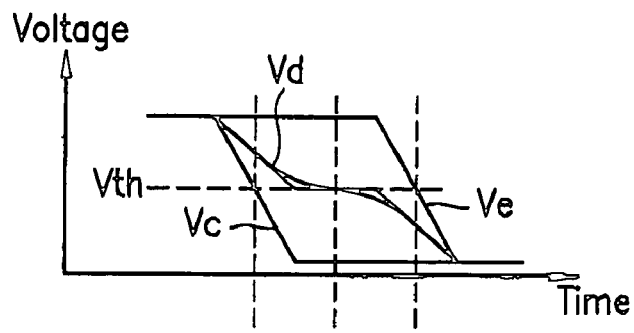
FIG. 17A is a graph showing an example set of output signals of the first and second circuit blocks shown in FIG. 12 included in the signal interpolation circuit of this invention.

As shown in FIG. 17A, signals Va' and Vb' having different phases are input to first circuit blocks 11B from inverters 41 and 42, respectively. As described above, the phases of the signals Va' and Vb' are inverted by the respective first circuit blocks 11B to be output as signals Vc and Ve, respectively. The second circuit block 12B outputs a signal Vd.

Figure 17B:
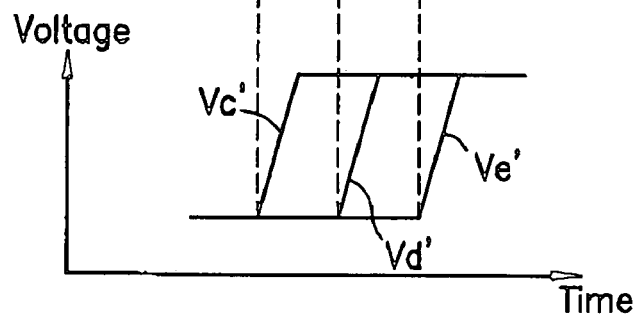
FIG. 17B is a graph showing the inverted output signals shown in FIG. 17A of the first and second circuit blocks included in the signal interpolation circuit of this invention.
Figure 17C:
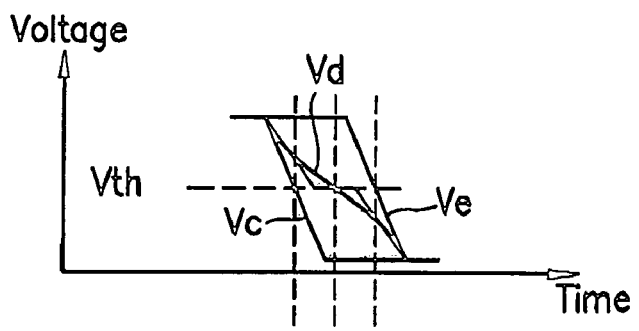
FIG. 17C is a graph showing another example set of output signals of the first and second circuit blocks shown in FIG. 12 included in the signal interpolation circuit of this invention.
Figure 17D:
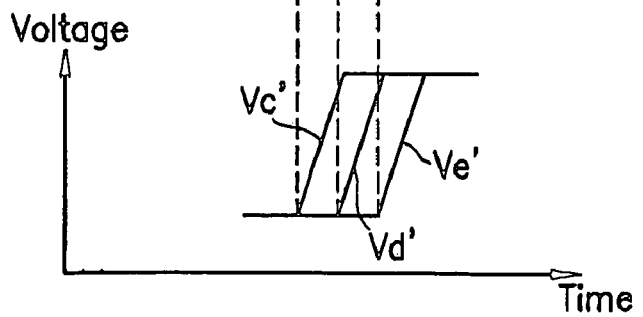
FIG. 17D is a graph showing the inverted output signals shown in FIG. 17C of the first and second circuit blocks included in the signal interpolation circuit of this invention.

In this case, as shown in FIG. 17C, when the signals Va' and Vb' input to the first circuit blocks 11B and the second circuit block 12B have a small phase difference, a large value of n in the inverters 11a' and 12a' increases a control current for the inverter portion 25. As shown in FIG. 17D, signals Vc' and Ve' output from the respective first circuit blocks 11B have a larger change (slope) in voltage relative to time than the case shown in FIG. 17B. The resistance of resistors 11b and 12b in the first and second circuit blocks 11B and 12B, respectively, are decreased while satisfying the foregoing expression (1). Therefore, the product of the resistance of resistor 11b and the input load capacitance of the inverter 43 or 45 which receives the output of the first circuit block 11B can be decreased. The product of the resistance of resistor 12b and the input load capacitance of the inverter 44 which receives the output of the second circuit block 12B also can be decreased. For this reason, the signal Vd output from the second circuit block 12B has a larger change in voltage relative to time than the case shown in FIG. 17A. Signals Vc', Vd', and Ve' output from the inverters 43, 44, and 45, respectively, thus have a smaller phase difference as shown in FIG. 17D.

As described above, an interpolation signal can be obtained in accordance with a phase difference between input signals. As shown in FIG. 10, the interpolation processor portions 10A, 20A, and 30A can perform appropriate interpolation in accordance with phase differences between input signals, even when a phase difference between signals input to the first interpolation processor portion 10A is different from a phase difference between signals input to the second interpolation processor portion 20A, and a phase difference between signals input to the second interpolation processor portion 20A is different from a phase difference between signals input to the third interpolation processor portion 30A.

EXAMPLE 3

Figure 18:
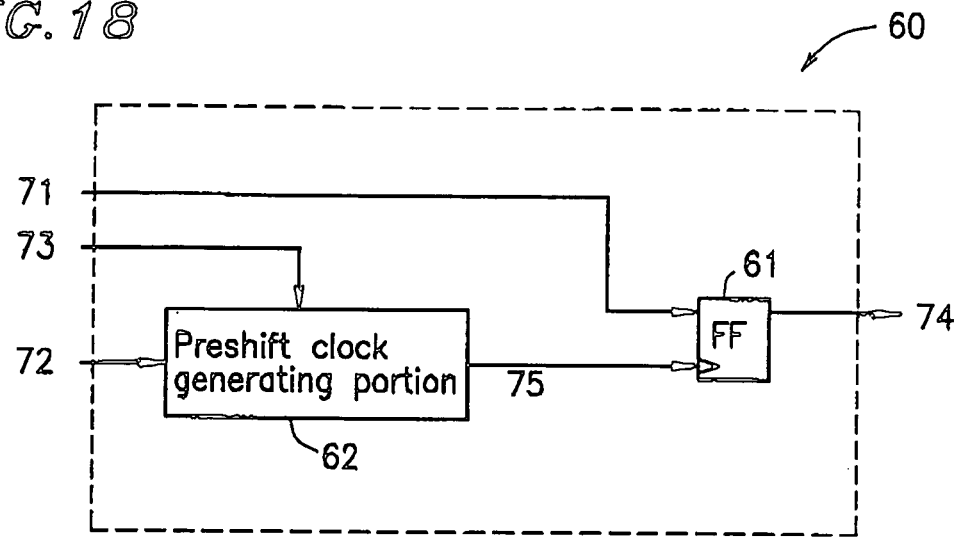
FIG. 18 is a diagram illustrating an overall configuration of a write compensation circuit portion used in the signal interpolation circuit of this invention.

The inverters 11a provided in the respective first circuit block 11A and the inverters 12a provided in the respective second circuit block 12A may be supplied with the respective bias voltages which are changed in accordance with input signals having arbitrary phase difference. FIG. 18 is a block diagram illustrating an example of a compensation circuit used in this case A compensation circuit 60 includes a flip-flop 61 (hereinafter referred to as FF) and a preshift clock generating portion 62. The FF 61 receives a data signal 71. The preshift clock generating portion 62 receives a clock signal 72 and a select signal 73. The preshift clock generating portion 62 outputs a write clock 75 based on the clock signal 72 and the select signal 73. The output write clock 75 is input to FF 61. FF 61 outputs write data 74 based on the data signal 71 in synchronization with the output write clock 75.

Figure 19:
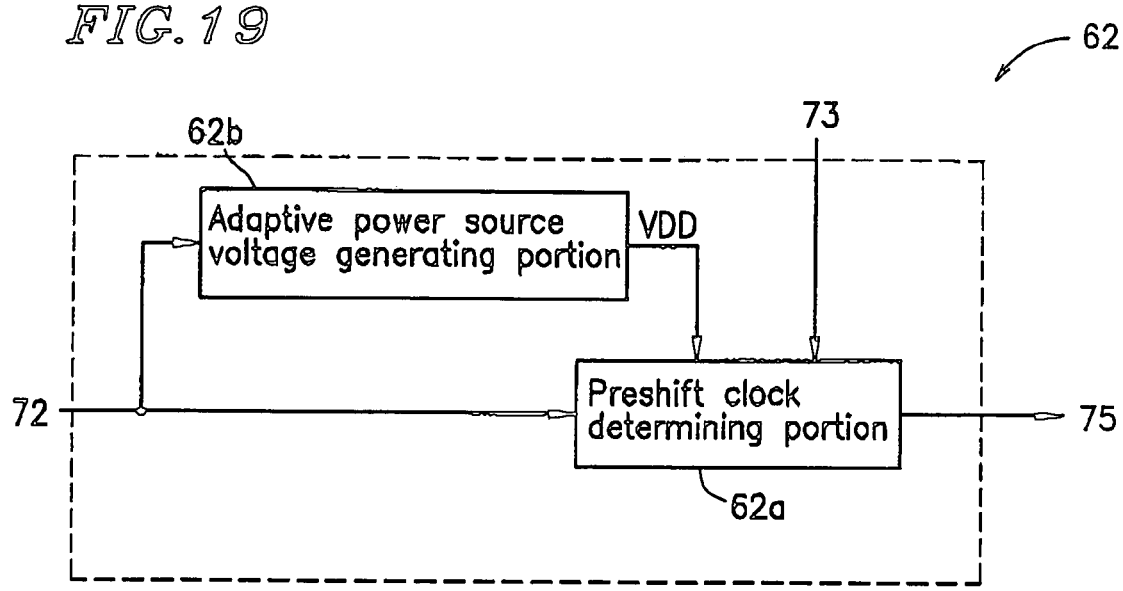
FIG. 19 is a block diagram illustrating a configuration of a preshift clock generatign portion included in the write compensation circuit portion shown in FIG. 18.

FIG. 19 is a block diagram illustrating an internal configuration of the preshift clock generating portion 62. The preshift clock generating portion 62 includes a preshift clock determining portion 62a and an adaptive power source voltage generating portion 62b. The clock signal 72 is input to both the preshift clock determining portion 62a and the adaptive power source voltage generating portion 62b. The adaptive power source voltage generating portion 62b outputs a driving voltage VDD to the preshift clock determining portion 62a in response to the received clock signal 72. The preshift clock determining portion 62a is driven by the driving voltage VDD.

The preshift clock determining portion 62a receives the select signal 73 directly. The preshift clock determining portion 62a driven by the driving voltage VDD outputs the write clock 75 based on the clock signal 72 and the select signal 73.

Figure 20:
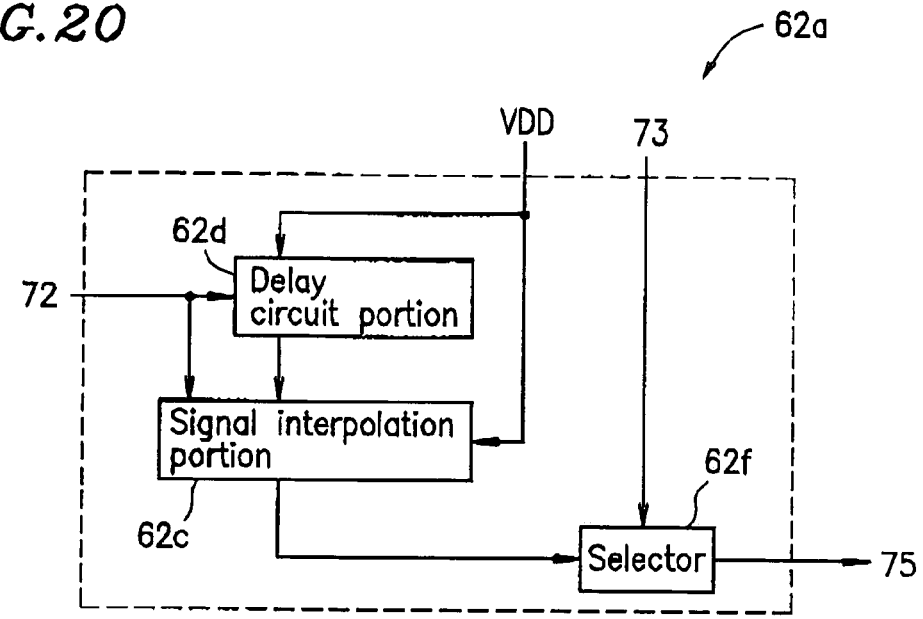
FIG. 20 is a block diagram illustrating a configuration of a preshift clock determining portion included in the preshift clock generating portion shown in FIG. 19.

FIG. 20 is a block diagram illustrating an internal configuration of the preshift clock determining portion 62a. The preshift clock determining portion 62a includes a delay circuit portion 62d and a signal interpolation portion 62a which are supplied with the clock signal 72. The delay circuit portion 62d is driven by the driving voltage VDD output from the adaptive power source voltage generating portion 62b. The signal interpolation portion 62c also is driven by the driving voltage VDD. The delay circuit portion 62d delays the received clock signal 72 and outputs the delayed clock signal to the signal interpolation portion 62c.

The signal interpolation portion 62a outputs an interpolating signal to a selector 62f in response to the received clock signal 72 and the delayed clock signal output from the delay circuit portion 62d. The selector 62f receives the select signal 73. The selector 62f selects the interpolating signals output from the signal interpolation portion 62c in response to the select signal 73 and outputs the selected interpolating signal as the write clock 75.

Figure 21:
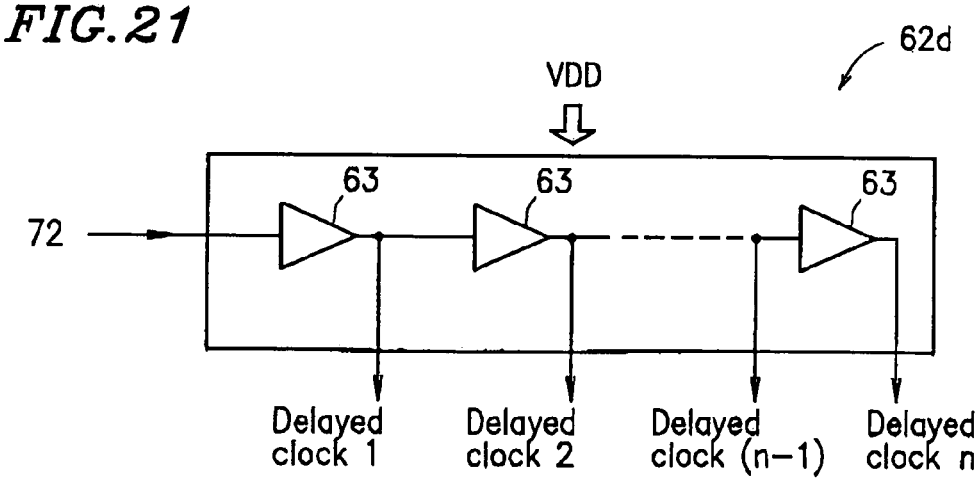
FIG. 21 is a block diagram illustrating a configuration of a delay circuit portion included in the preshift clock determining portion shown in FIG. 20.

FIG. 21 is a circuit diagram illustrating an internal configuration of the delay circuit portion 62d provided in the preshift clock determining portion 62a. The delay circuit portion 624 driven by the driving voltage VDD includes n buffers 63 having like circuit configuration which are connected in series to one after another. A clock signal is input to a buffer 63 positioned at an end of the series connection. The outputs of the buffers 63 are successively output as delayed clocks 1, 2, . . . , (n−1), n, respectively, to the signal interpolation portion 62a.

The driving voltage VDD supplied to the delay circuit portion 62d is designed to hold an overall delay amount of delayed clocks output from the buffers 63 equal to a clock period. For this reason, the delay amount of a delayed clock output each buffer 63 is equal to 1/n of the clock period. The driving voltage VDD supplied to each buffer 63 is determined by the adaptive power source voltage generating portion 62b in response to the clock signal 72 input to the adaptive power source voltage generating portion 62b.

Note that in FIG. 20, one line represents signal lines for the delayed clocks 1 through n output from the delay circuit portion 62d.

Figure 22:
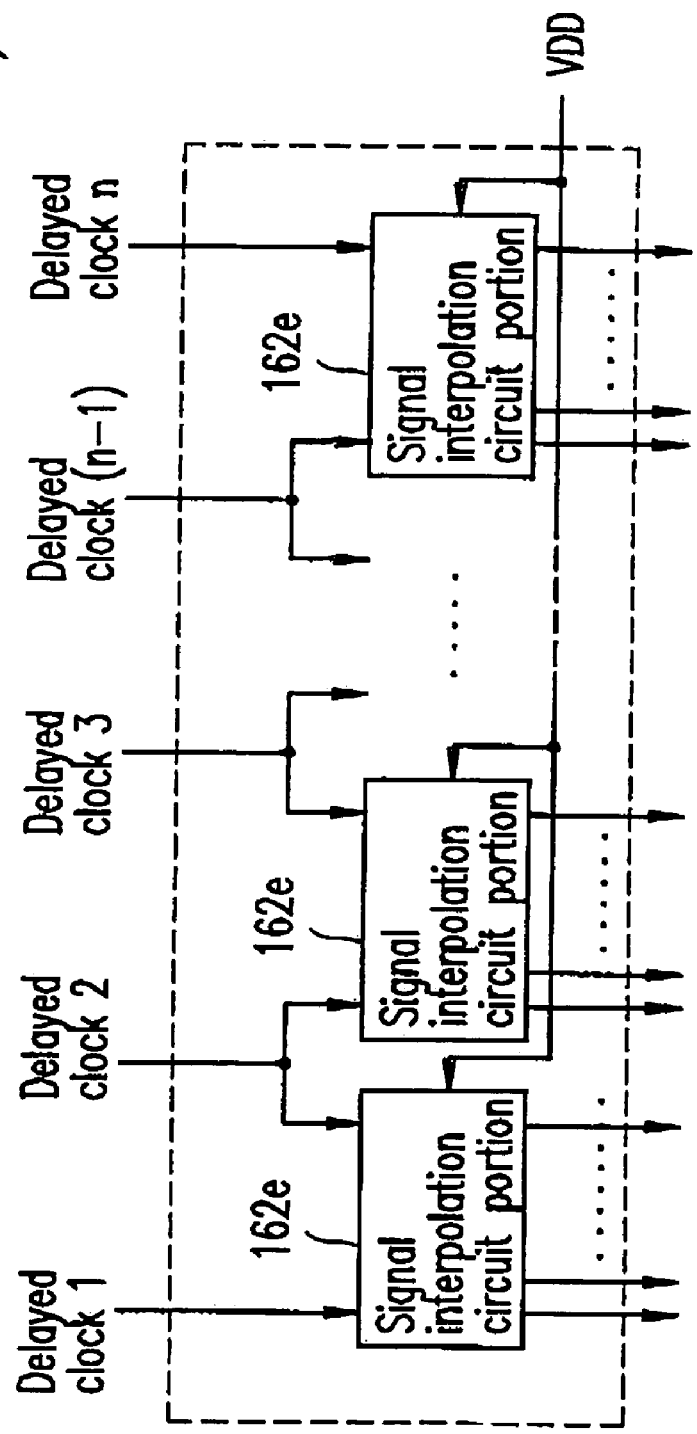
FIG. 22 is a diagram illustrating a configuration of a signal interpolation portion used in the preshift clock determining portion shown in FIG. 21.
Figure 23:
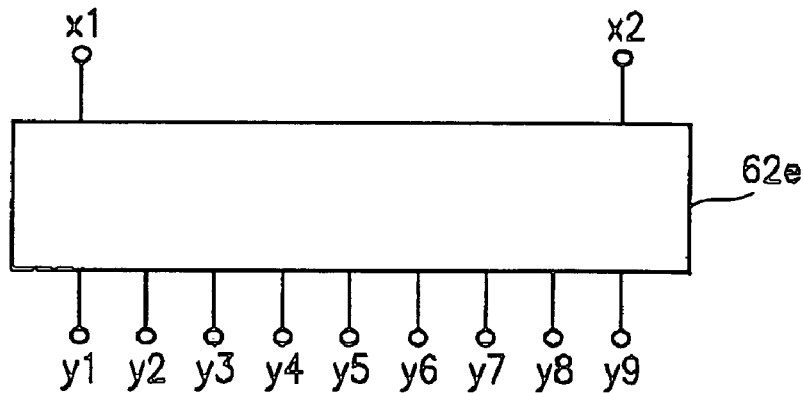
FIG. 23 is a diagram illustrating an example of a signal interpolation circuit portion.
Figure 24A:
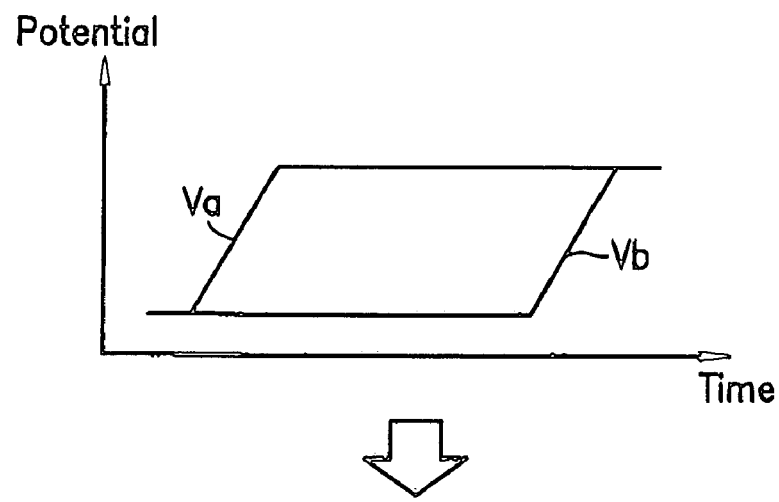
FIG. 24A is a graph illustrating an input signal of the signal interpolation circuit portion shown in FIG. 23.
Figure 24B:
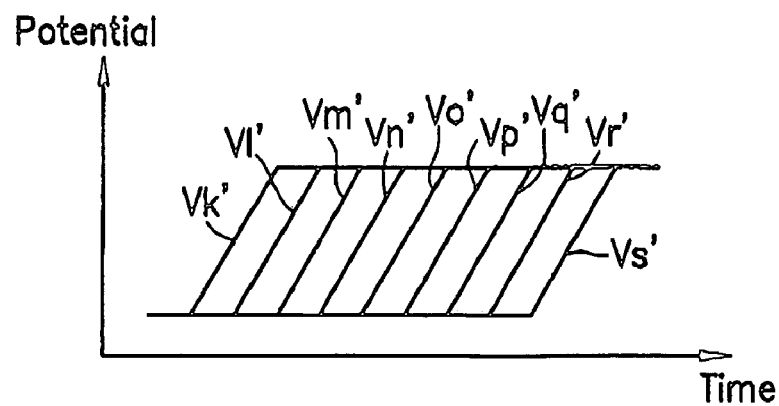
FIG. 24B is a graph illustrating an output signal of the signal interpolation circuit portion shown in FIG. 23.
Figure 25:
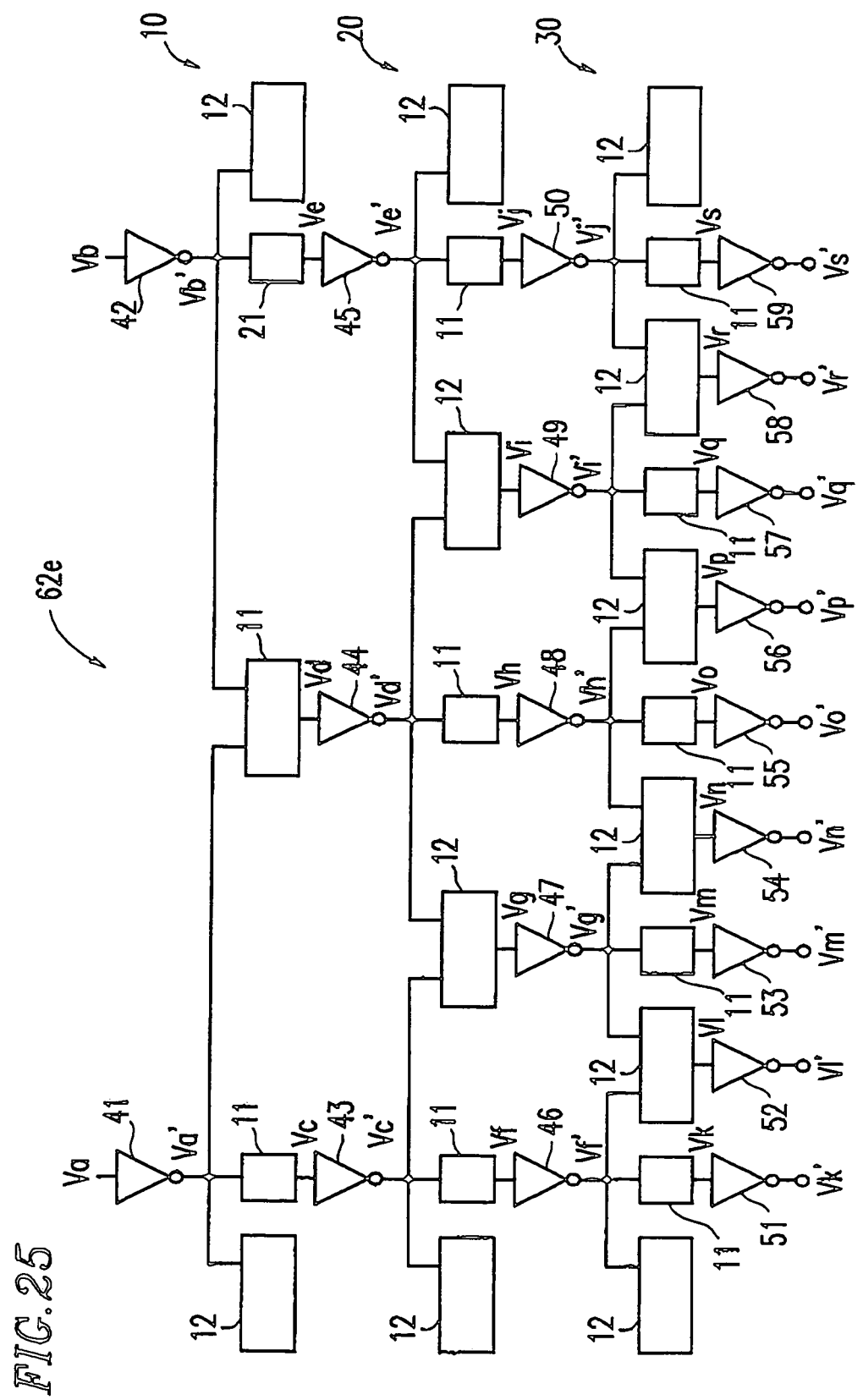
FIG. 25 is a circuit diagram illustrating a concrete configuration of the signal interpolation circuit portion shown in FIG. 23.
Figure 26A:
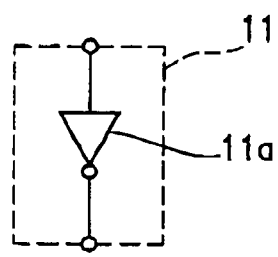
FIG. 26A is a circuit diagram illustrating a concrete configuration of a first circuit block shown in FIG. 25.
Figure 26B:
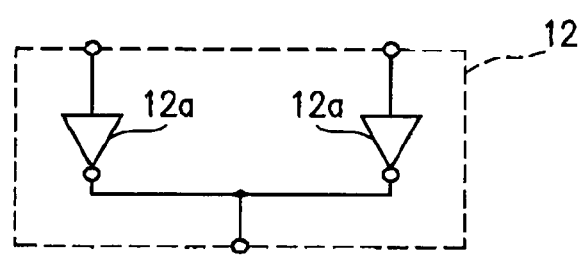
FIG. 26B is a circuit diagram illustrating a concrete configuration of a second circuit block shown in FIG. 25.
Figure 27:
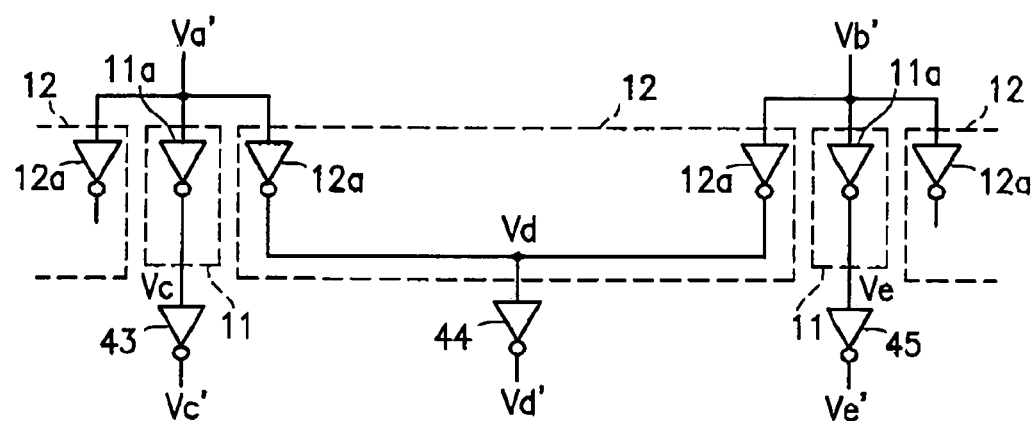
FIG. 27 is a circuit diagram illustrating a concrete configuration of a signal interpolation circuit included in the signal interpolation circuit portion shown in FIG. 25.

FIG. 22 is a block diagram illustrating an internal configuration of the signal interpolation portion 62c. The signal interpolation portion 62c includes n signal interpolation circuit portions 162e which have a configuration similar to that of the signal interpolation circuit portion 162e shown in FIG. 10. First and second circuit blocks 11B and 12B in each signal interpolation circuit portion 162e shown in FIG. 22 includes the inverters 11a' and 12a' shown in FIGS. 14A and 14B, respectively. As shown in FIGS. 14A and 14B, the resistors 11b and 12b are connected to the inverters 11a' and 12a', respectively.

In each signal interpolation circuit portion 162e, the driving voltage VDD generated by the adaptive power source voltage generating portion 62b (FIG. 19) is supplied to the inverters 11a' and 12a' in the first and second circuit blocks 11D and 12B, respectively, as a bias voltage for control thereof. Each signal interpolation circuit portion 162e receives a pair of delayed clocks successively output from the delay circuit portion 62d (FIG. 21). The delayed clocks 1 and 2 are input to a signal interpolation circuit portion 162e. The delayed clocks 2 and 3 are input to another signal interpolation circuit portion 162e. Similarly, the delayed clocks (n−1) and n are input to a signal interpolation circuit portion 162e.

Each signal interpolation circuit portion 162e receives a pair of input signals having a phase difference and outputs a pair of output signals having a phase similar to that of the corresponding input signal. Each signal interpolation circuit portion 162e also outputs seven output signals interpolating between the phases of the pair of output signals. As a result, when the delay circuit portion 62d outputs delayed clocks based on the clock signal 72 input to each signal interpolation portion 62c (FIG. 20), each delayed clock is output from each signal interpolation circuit portion 162e as interpolating signals having an increased level of delay resolution.

Note that in FIG. 20, one line represents signal lines for the interpolating signals output from the signal interpolation circuit portions 62c.

In each signal interpolation circuit portion 162e, the driving voltage VDD is used as a bias voltage VB for the inverters 11a' and 11b'. In the adaptive power source generating portion 62b in FIG. 19, the driving voltage VDD is set to a high level when the clock signal 72 has a short period. The driving voltage VDD is set to a low level when the clock signal 72 has a long period. For this reason, the overall delay amount in the delay circuit portion 62 shown in FIG. 20 becomes equal to the period of the clock signal 72.

Therefore, when the clock signal 72 has a short period, a pair of input signals (delayed clock) input to the signal interpolation circuit portion 162e shown in FIG. 22 has a small phase difference When the clock signal 72 has a long period, a pair of input signals (delayed clock) input to the signal interpolation circuit portion 162e has a large phase difference. For this reason, when a pair of input signals input to the signal interpolation circuit portion 162e has a large phase difference, the driving voltage VDD is decreased. When a pair of input signals input to the signal interpolation circuit portion 162e has a small phase difference, the driving voltage VDD is increased. As a result, when a pair of input signals input to the signal interpolation circuit portion 162e has a small phase difference, the anmount of a control current flowing through an inverter 11a' or 12a' in the signal interpolation circuit portion 162e is relatively larger as compared with when the phase difference of the pair of input signals is large. The signal interpolation circuit portion 162e thus can perform signal interpolation in accordance with the period of the clock signal 72.

According to this invention, the delay circuit having a plurality of buffers is designed to constantly have an overall delay amount equal to a clock period. The delay amount for each buffer can have a linear relationship with the clock period. For this reason, the delay amount of a signal in the delay circuit of the write compensation circuit has a decreased tendency of fluctuation due to a temperature change and a power source voltage change, thereby holding the accuracy of the delay amount against the changes.

Furthermore, according to this invention, the write compensation circuit does not need a compensation portion performing temperature compensation and phase compensation as used in a technique using VCO. The write compensation circuit has a small circuit size as compared with the technique using VCO.

The signal interpolation circuit of this invention includes a control section for controlling the propagation speed of a signal as described above. This control section generates interpolating signals, which interpolate a pair of signals having a phase difference, with high accuracy. Further, since the propagating speed of a signal is controlled in accordance with an arbitrary phase difference of the input signals, the signal interpolation circuit of this invention is suitable for a write compensation circuit for writing data onto a storage device.

Various other modifications will be apparent to and can be readily made by those stilled in the art without departing from the scope and spirit of this invention. Accordingly, it is not intended that the scope of the claims appended hereto be limited to the description as set forth herein, but rather that the claims be broadly construed.

What is claimed is:

1. A write compensation circuit of a recording device comprising:
 a first delay portion driven by a first driving voltage, for receiving a clock signal, delaying the clock signal by a first delay time, and outputting the delayed clock signal; and
 a voltage supplying portion for supplying the first driving voltage to the first delay portion in such a manner that the first delay time is substantially equal to a clock period of the clock signal.

2. A write compensation circuit according to claim 1, wherein:
 the voltage supplying portion comprises:
  a second delay portion driven by a second driving voltage and having the same configuration as that of the first delay portion, for receiving a clock signal, delaying the clock signal by a second delay time, and outputting the delayed clock signal;
  a determining portion for determining whether the second delay time is within a predetermined range; and
  a voltage select portion for selecting, according to a result of determination of the determining portion, the first driving voltage supplied to the first delay portion and selecting the second driving voltage supplied to the second delay portion.

3. A write compensation circuit according to claim 2, wherein:
 the first delay portion comprises:
  a selector for selecting a predetermined pattern in response to a select signal; and
  a delay circuit for delaying the clock signal by a delay amount corresponding to the predetermined pattern selected by the selector.

* * * * *